(12) United States Patent
Yang et al.

(10) Patent No.: US 11,677,387 B2
(45) Date of Patent: *Jun. 13, 2023

(54) CLOCK CIRCUIT AND METHOD OF OPERATING THE SAME

(71) Applicant: TAIWAN SEMICONDUCTOR MANUFACTURING COMPANY, LTD., Hsinchu (TW)

(72) Inventors: Hao-I Yang, Hsinchu (TW); Cheng Hung Lee, Hsinchu (TW); Chen-Lin Yang, Hsinchu (TW); Chiting Cheng, Hsinchu (TW); Fu-An Wu, Hsinchu (TW); Yangsyu Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/733,673

(22) Filed: Apr. 29, 2022

(65) Prior Publication Data
US 2022/0255538 A1 Aug. 11, 2022

Related U.S. Application Data

(63) Continuation of application No. 17/200,195, filed on Mar. 12, 2021, now Pat. No. 11,323,101, which is a
(Continued)

(51) Int. Cl.
*G06F 1/04* (2006.01)
*H03K 3/037* (2006.01)
(Continued)

(52) U.S. Cl.
CPC .............. *H03K 3/037* (2013.01); *G06F 1/04* (2013.01); *G06F 1/06* (2013.01); *G11C 7/222* (2013.01);
(Continued)

(58) Field of Classification Search
CPC .... H03K 3/037; H03K 3/0372; H03K 3/0377; H03K 3/356; H03K 3/356017;
(Continued)

(56) References Cited

U.S. PATENT DOCUMENTS 7,622,955 B2   11/2009  Vilangudipitchai et al.
7,924,061 B2*  4/2011   Guillot ...................... G06F 1/24
                                                          327/20
(Continued)

FOREIGN PATENT DOCUMENTS

EP   1801969    6/2007
JP   2561770    12/1996
TW   200926600  6/2009

OTHER PUBLICATIONS

Notice of Allowance dated Mar. 27, 2019 from corresponding application No. TW 107125544, all pages.
(Continued)

*Primary Examiner* — Long Nguyen
(74) *Attorney, Agent, or Firm* — Hauptman Ham, LLP

(57) ABSTRACT

A clock circuit includes a latch circuit, a memory state latch circuit, a first inverter, a memory state trigger circuit and a second inverter. The latch circuit is configured to latch an enable signal, and to generate a latch output signal based on a first clock signal and a first output clock signal. The memory state latch circuit is configured to latch a second output clock signal responsive to a third output clock signal. The first inverter is configured to generate the first output clock signal responsive to the third output clock signal. The memory state trigger circuit is configured to generate the second output clock signal responsive to the latch output signal. The second inverter is configured to generate the first clock signal responsive to a second clock signal, and con-
(Continued)

figured to control the latch circuit and the memory state trigger circuit based on the first clock signal.

20 Claims, 10 Drawing Sheets

Related U.S. Application Data continuation of application No. 16/800,981, filed on Feb. 25, 2020, now Pat. No. 10,951,200, which is a continuation of application No. 16/207,064, filed on Nov. 30, 2018, now Pat. No. 10,574,213, which is a continuation of application No. 16/039,824, filed on Jul. 19, 2018, now Pat. No. 10,340,897.

(60) Provisional application No. 62/538,462, filed on Jul. 28, 2017.

(51) Int. Cl.
  *G06F 1/06* (2006.01)
  *G11C 7/22* (2006.01)
  *G11C 11/417* (2006.01)
  *G11C 11/412* (2006.01)

(52) U.S. Cl.
  CPC ........... *G11C 11/412* (2013.01); *G11C 11/417* (2013.01)

(58) Field of Classification Search
  CPC ....... H03K 3/356069; H03K 3/356086; H03K 3/3562; H03K 3/35625; G06F 1/04; G06F 1/06; G06F 1/10; G06F 1/24; G11C 7/222; G11C 11/412; G11C 11/417
  See application file for complete search history.

(56) References Cited

U.S. PATENT DOCUMENTS

| | | | |
|---|---|---|---|
| 8,812,893 B1 | 8/2014 | Venkata et al. | |
| 10,340,897 B2* | 7/2019 | Yang | G06F 1/04 |
| 10,574,213 B2* | 2/2020 | Yang | G06F 1/06 |
| 10,951,200 B2* | 3/2021 | Yang | G06F 1/04 |
| 11,323,101 B2* | 5/2022 | Yang | G06F 1/04 |
| 2013/0214839 A1* | 8/2013 | Alben | H03K 3/012 |
| | | | 327/215 |
| 2019/0103858 A1 | 4/2019 | Yang | |

OTHER PUBLICATIONS

Notice of Allowance dated Aug. 20, 2019 and English translation from corresponding application No. KR 10-2018-0088557, all pages.

\* cited by examiner

CLOCK CIRCUIT AND METHOD OF OPERATING THE SAME

PRIORITY CLAIM AND CROSS-REFERENCE

This application is a continuation of U.S. application Ser. No. 17/200,195, filed Mar. 12, 2021, now U.S. Pat. No. 11,323,101, issued May 3, 2022, which is a continuation of U.S. application Ser. No. 16/800,981, filed Feb. 25, 2020, now U.S. Pat. No. 10,951,200, issued Mar. 16, 2021, which is a continuation of U.S. application Ser. No. 16/207,064, filed Nov. 30, 2018, now U.S. Pat. No. 10,574,213, issued Feb. 25, 2020, which is a continuation of U.S. application Ser. No. 16/039,824, filed Jul. 19, 2018, now U.S. Pat. No. 10,340,897, issued Jul. 2, 2019, which claims the priority of U.S. Provisional Application No. 62/538,462, filed Jul. 28, 2017, which are herein incorporated by reference in their entireties.

BACKGROUND

The semiconductor integrated circuit (IC) industry has produced a wide variety of digital devices to address issues in a number of different areas. Some of these digital devices, such as clock circuits, are configured to generate one or more clock signals. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
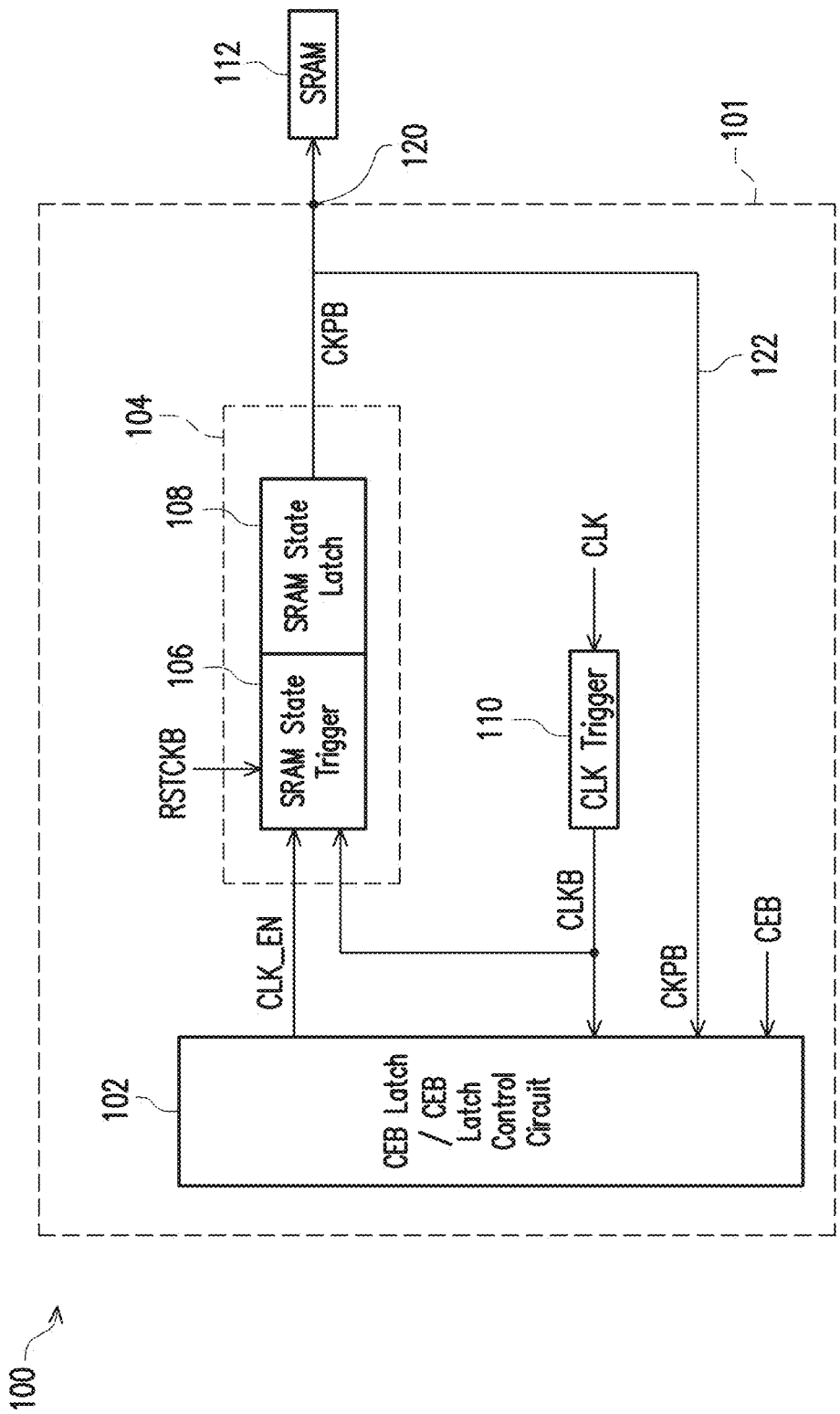
FIG. 1 is a block diagram of a clock circuit, in accordance with some embodiments.

The following disclosure provides different embodiments, or examples, for implementing features of the provided subject matter. Specific examples of components, materials, values, steps, arrangements, etc., are described below to simplify the present disclosure. These are, of course, merely examples and are not limiting. Other components, materials, values, steps, arrangements, etc., are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a clock circuit includes a first latch, second latch, first trigger circuit and clock trigger circuit. The first latch is configured to generate a first latch output signal based on a first control signal, an enable signal and an output clock signal. The second latch is coupled to the first latch, and configured to generate the output clock signal responsive to a second control signal. The first trigger circuit is coupled to the first latch and the second latch, and configured to adjust the output clock signal responsive to at least the first latch output signal or a reset signal. The clock trigger circuit is coupled to the first latch and the first trigger circuit by a first node, is configured to generate the first control signal responsive to an input clock signal, and configured to control the first latch and the first trigger circuit based on at least the first control signal.

In some embodiments, by using the clock trigger circuit to control each of the first latch and the first trigger circuit, the first latch and the first trigger circuit are each controlled at a single clock enable path. By using a single clock enable path to control the first latch and the first trigger circuit, the clock circuit of the present disclosure is less susceptible to process, voltage, and temperature (PVT) variations than other approaches. In some embodiments, by using the clock trigger circuit to control each of the first latch circuit and the first trigger circuit, the clock circuit of the present disclosure is race free under a larger range of PVT variations than other approaches. In some embodiments, by using the clock trigger circuit to control each of the first latch and the first trigger circuit, the clock circuit of the present disclosure has better immunity to clock slew variation than other approaches. In some embodiments, by using the clock trigger circuit with a level shifter circuit, the clock circuit of the present disclosure has a larger range of operating voltages than other approaches.

Clock Circuit

FIG. 1 is a block diagram of an integrated circuit 100, in accordance with some embodiments. In the embodiment of FIG. 1, integrated circuit 100 is a static random access memory (SRAM) macro. SRAM is used for illustration, and other types of memories are within the scope of various embodiments.

Integrated circuit 100 includes a clock circuit 101 connected to an SRAM circuit 112. Clock circuit 101 is configured to receive a signal CLK and a signal CEB, and to output a signal CKPB on an output terminal 120 to SRAM circuit 112. Clock circuit 101 is configured to generate signal CKPB based on signal CLK and signal CEB. Signal CKPB is a generated clock signal useable by SRAM circuit 112.

Signal CLK is an internal clock signal of integrated circuit 100. Signal CEB is a chip enable bar (CEB) signal which indicates that SRAM circuit 112 is in an active state or an inactive state. In some embodiments, CEB signal is logically high when SRAM circuit 112 is inactive, and CEB signal is logically low when SRAM circuit 112 is active.

SRAM circuit 112 is configured to receive signal CKPB. SRAM circuit 112 is configured to store data, read data or retain data based on signal CKPB. In some embodiments, signal CKPB is useable by SRAM circuit 112 as a clock signal which indicates a state of the SRAM circuit 112. In some embodiments, the state of the SRAM circuit 112 includes one or more of a write state, a read state or a standby state. SRAM is used for illustration for SRAM circuit 112, and other types of memories for circuit 112 are within the scope of various embodiments.

Clock circuit 101 comprises a latch circuit 102, an SRAM state circuit 104 and a clock trigger circuit 110.

Latch circuit 102 is coupled to SRAM state circuit 104 and clock trigger circuit 110. Latch circuit 102 is configured to receive a signal CLKB, signal CKPB and signal CEB.

Latch circuit 102 is configured to generate signal CLK_EN responsive to signal CLKB, signal CKPB and signal CEB. Latch circuit 102 is configured to latch or store a state of signal CEB, and thus latch circuit 102 is referred to as a CEB latch circuit. In some embodiments, latch circuit 102 is configured to be reset by signal CKPB. Signal CLK_EN is an enable clock signal that controls SRAM state circuit 104. In some embodiments, latch circuit 102 is also referred to as a "CEB latch/CEB latch control circuit." Signal CLKB is a trigger signal generated by clock trigger circuit 110. In some embodiments, signal CLKB is an inverted clock signal (e.g., signal CLK).

SRAM state circuit 104 is coupled to latch circuit 102, clock trigger circuit 110, SRAM circuit 112. SRAM state circuit 104 is configured to receive signal CLK_EN, signal CLKB and a signal RSTCKB. SRAM state circuit 104 is configured to latch or store a state of signal CKPB. Signal RSTCKB is a reset signal. In some embodiments, SRAM state circuit 104 is configured to be reset by signal RSTCKB. In some embodiments, signal RSTCKB is triggered to change logic states based on a tracking bit line signal (not shown). SRAM state circuit 104 is configured to generate signal CKPB. SRAM state circuit 104 is configured to output signal CKPB to latch circuit 102 by being coupled to latch circuit 102 by a feedback path 122.

SRAM state circuit 104 includes an SRAM state trigger circuit 106 and an SRAM state latch circuit 108.

SRAM state trigger circuit 106 is coupled to latch circuit 102, SRAM state latch circuit 108 and clock trigger circuit 110. SRAM state trigger circuit 106 is configured to receive signal CLK_EN, signal CLKB and signal RSTCKB. In some embodiments, SRAM state trigger circuit 106 is configured to control the state of SRAM state latch circuit 108 by at least signal RSTCKB, signal CLKB or signal CLK_EN.

SRAM state latch circuit 108 is coupled to latch circuit 102 by feedback path 122, and coupled to SRAM state trigger circuit 106. In some embodiments, SRAM state trigger circuit 106 is part of SRAM state latch circuit 108 and vice versa. SRAM state latch circuit 108 is configured to generate clock signal CKPB based on at least signal RSTCKB, signal CLKB or signal CLK_EN. SRAM state latch circuit 108 is configured to latch or store the state of signal CKPB. In some embodiments, SRAM state latch circuit 108 is reset by signal RSTCKB.

Clock trigger circuit 110 is coupled to SRAM state trigger circuit 106 and latch circuit 102. Clock trigger circuit 110 is configured to receive signal CLK. Clock trigger circuit 110 is configured to generate signal CLKB responsive to signal CLK. Clock trigger circuit 110 is configured to control each of the latch circuit 102 and the SRAM state trigger circuit 106 by a single trigger signal (e.g., signal CLKB). Clock trigger circuit 110 is a single trigger circuit compared to other approaches that use independent trigger circuits.

In some embodiments, each of the latch circuit 102 and the SRAM state trigger circuit 106 is controlled by a single trigger circuit (e.g., clock trigger circuit 110) and a corresponding single trigger signal (e.g., signal CLKB) compared to other approaches that use independent trigger circuits that generate corresponding independent trigger signals to control the corresponding latch circuits.

In some embodiments, by using clock trigger circuit 110 to control each of the latch circuit 102 and the SRAM state trigger circuit 106 by a single signal, clock circuit 101 is less susceptible to PVT variations than other approaches. In some embodiments, by being less susceptible to PVT variations, and using clock trigger circuit 110 to control each of the latch circuit 102 and the SRAM state trigger circuit 106, clock circuit 101 is race-free under a larger range of PVT variations than other approaches. In some embodiments, by being less susceptible to PVT variations and by using clock trigger circuit 110 to control each of the latch circuit 102 and the SRAM state trigger circuit 106, clock circuit 101 has better immunity to clock slew variation than other approaches. In some embodiments, by being less susceptible to PVT variations and by using clock trigger circuit 110 to control each of the latch circuit 102 and the SRAM state trigger circuit 106, clock circuit 101 has a larger range of operating voltages than other approaches.

Figure 2:
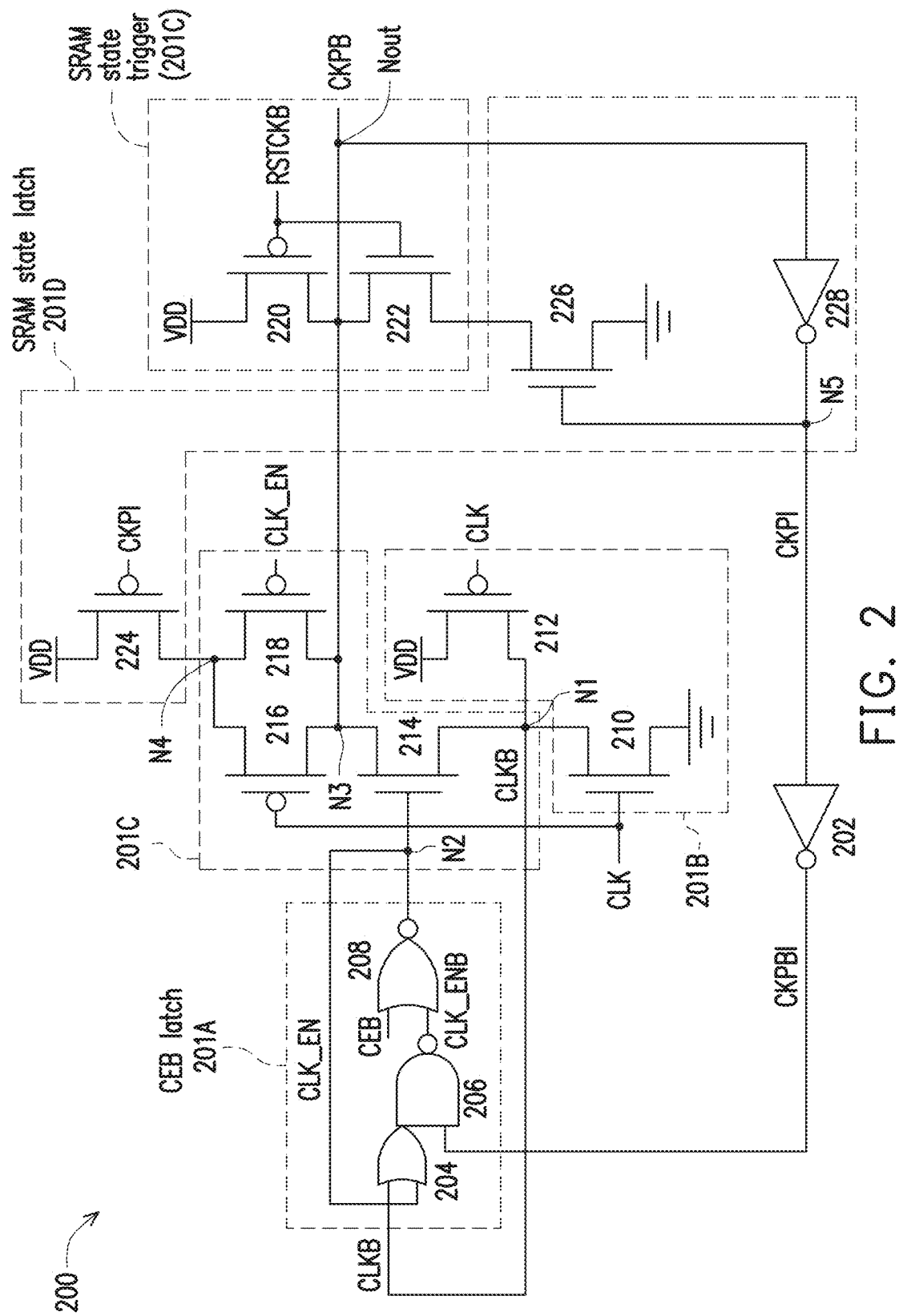
FIG. 2 is a circuit diagram of a clock circuit, in accordance with some embodiments.

FIG. 2 is a circuit diagram of a clock circuit 200, in accordance with some embodiments.

Clock circuit 200 is an embodiment of clock circuit 101 of FIG. 1. Components that are the same or similar to those in one or more of FIGS. 1 and 3-9 (shown below) are given the same reference numbers, and detailed description thereof is thus omitted.

Clock circuit 200 comprises a latch circuit 201A, a clock trigger circuit 201B, an SRAM state trigger circuit 201C, an SRAM state latch circuit 201D, and an inverter 202.

Latch circuit 201A is an embodiment of latch circuit 102 of FIG. 1, and similar detailed description is omitted. Clock trigger circuit 201B is an embodiment of clock trigger circuit 110 of FIG. 1, and similar detailed description is omitted. SRAM state trigger circuit 201C is an embodiment of SRAM state trigger circuit 106 of FIG. 1, and similar detailed description is omitted. SRAM state latch circuit 201D is an embodiment of SRAM state latch circuit 108 of FIG. 1, and similar detailed description is omitted.

Inverter 202 is connected between latch circuit 201A and SRAM state latch circuit 201D. An input terminal of inverter 202 is configured to receive a signal CKPI. An output terminal of inverter 202 is configured to output a signal CKPBI. In some embodiments, signal CKPBI is an inverted version of signal CKPI. Inverter 202 is configured to generate signal CKPBI based on signal CKPI.

Latch circuit 201A includes an OR gate 204, a NAND gate 206 and a NOR gate 208.

A first input terminal of OR gate 204 is configured to receive a signal CLKB. Each of the first input terminal of OR gate 204, a drain terminal of NMOS transistor 210, a drain terminal of PMOS transistor 212 and a source terminal of NMOS transistor 214 are coupled to each other at a node N1. Signal CLKB is a voltage of node N1.

A second input terminal of OR gate 204 is configured to receive a signal CLK_EN. Each of the second input terminal of OR gate 204, an output terminal of NOR gate 208 and a gate terminal of NMOS transistor 214 are coupled to each other at a node N2. Signal CLK_EN is a voltage of node N2.

An output terminal of OR gate 204 is configured to output an OR output signal (not labelled). OR gate 204 is configured to generate the OR output signal (not labelled) based on signal CLK_EN and signal CLKB.

A first input terminal of NAND gate 206 is directly coupled to the output terminal of OR gate 204. The first input terminal of NAND gate 206 is configured to receive the OR output signal (not labeled) from OR gate 204. A second input terminal of NAND gate 206 is directly coupled to the output terminal of inverter 202. The second input terminal of NAND gate 206 is configured to receive signal CKPBI. An output terminal of NAND gate 206 is configured to output a signal CLK_ENB. NAND gate 206 is configured to generate signal CLK_ENB based on signal CKPBI and OR output signal (not labelled).

A first input terminal of NOR gate 208 is configured to receive signal CEB. A second input terminal of NOR gate 208 is configured to receive signal CLK_ENB. The second input terminal of NOR gate 208 is directly coupled to the output terminal of NAND gate 206. An output terminal of NOR gate 208 is configured to output signal CLK_EN to node N2. NOR gate 208 is configured to set the voltage of node N2. The voltage of node N2 is signal CLK_EN. NOR gate 208 is configured to generate signal CLK_EN based on signal CEB and signal CLK_ENB. Other configurations of logic gates, number of logic gates or logic gates types of clock circuit 200 are within the scope of the present disclosure.

Clock trigger circuit 201B includes an NMOS transistor 210 and a PMOS transistor 212.

A gate terminal of NMOS transistor 210 is configured to receive clock signal CLK. NMOS transistor 210 is turned on or off based on signal CLK. A source terminal of NMOS transistor 210 is coupled with a supply reference voltage VSS.

A gate terminal of PMOS transistor 212 is configured to receive clock signal CLK. PMOS transistor 212 is turned on or off based on signal CLK. A source terminal of PMOS transistor 212 is coupled with a supply voltage VDD. Together NMOS transistor 210 and PMOS transistor 212 function as an inverter configured to set a voltage of node N1. The voltage of node N1 is signal CLKB.

SRAM state trigger circuit 201C includes an NMOS transistor 214, a PMOS transistor 216, a PMOS transistor 218, a PMOS transistor 220 and an NMOS transistor 222.

The gate terminal of NMOS transistor 214 is configured to receive signal CLK_EN from NOR gate 208. NMOS transistor 214 is controlled by NOR gate 208 and is turned on or off based on signal CLK_EN. The source terminal of NMOS transistor 214 is coupled to at least node N1. Each of a drain terminal of NMOS transistor 214, a drain terminal of PMOS transistor 216, a drain terminal of PMOS transistor 218, a drain terminal of PMOS transistor 220, a drain terminal of NMOS transistor 222 and an input terminal of inverter 228 are coupled to each other at a node N3.

A gate terminal of PMOS transistor 216 is coupled to the gate terminal of NMOS transistor 210. The gate terminal of PMOS transistor 216 is configured to receive clock signal CLK. PMOS transistor 216 is turned on or off based on signal CLK. In some embodiments, each of the gate terminal of PMOS transistor 216, the gate terminal of PMOS transistor 212 and the gate terminal of NMOS transistor 210 are coupled together. Each of a source terminal of PMOS transistor 216, a source terminal of PMOS transistor 218 and a drain terminal of PMOS transistor 224 are coupled to each other at a node N4.

A gate terminal of PMOS transistor 218 is configured to receive signal CLK_EN. PMOS transistor 218 is turned on or off based on signal CLK_EN. In some embodiments, the gate terminal of PMOS transistor 218 is coupled to node N2. In some embodiments, each of the gate terminal of PMOS transistor 218, the gate terminal of NMOS transistor 214, the output terminal of NOR gate 208 and the second input terminal of OR gate 204 are coupled to each other at node N2.

A gate terminal of PMOS transistor 220 is configured to receive signal RSTCKB. PMOS transistor 220 is turned on or off based on signal RSTCKB. A source terminal of PMOS transistor 220 is coupled with supply voltage VDD.

A gate terminal of NMOS transistor 222 is coupled with the gate terminal of PMOS transistor 220. The gate terminal of transistor 222 is configured to receive signal RSTCKB. NMOS transistor 222 is turned on or off based on signal RSTCKB. A source terminal of NMOS transistor 222 is coupled with a drain terminal of NMOS transistor 226. The drain terminal of NMOS transistor 222 is coupled with the drain terminal of PMOS transistor 220. Together NMOS transistor 220 and PMOS transistor 222 function as an inverter configured to set a voltage of node N3. The voltage of node N3 is signal CKPB. In some embodiments, node N3 corresponds to an output terminal Nout of clock circuit 200. In some embodiments, by positioning PMOS transistor 220 in the present location, when PMOS transistor 220 and NMOS transistor 222 switch on or off causes node N3 to float resulting in a dynamic logic type clock circuit.

SRAM state latch circuit 201D includes a PMOS transistor 224, an NMOS transistor 226 and an inverter 228.

A gate terminal of PMOS transistor 224 is configured to receive signal CKPI from inverter 228. PMOS transistor 224 is turned on or off based on signal CKPI. In some embodiments, the gate terminal of PMOS transistor 224 is coupled to each of a gate terminal of NMOS transistor 226, an output terminal of inverter 228 and the input terminal of inverter 202. A source terminal of PMOS transistor 224 is coupled with supply voltage VDD. The drain terminal of PMOS transistor 224 is coupled with at least node N4.

Each of a gate terminal of NMOS transistor 226, an output terminal of inverter 228 and the input terminal of inverter 202 are coupled to each other at a node N5. The voltage of node N5 is signal CKPI. NMOS transistor 226 is turned on or off based on signal CKPI. A source terminal of NMOS transistor 226 is coupled to supply reference voltage VSS.

The input terminal of inverter 228 is configured to receive a signal CKPB. The output terminal of inverter 228 is configured to output signal CKPI. In some embodiments, signal CKPI is an inverted version of signal CKPB. Inverter 228 is configured to generate signal CKPI based on signal CKPB. Inverter 228 is configured to set the voltage of node N5 by signal CKPI. In some embodiments, signal CKPI corresponds to a feedback signal fed back to NMOS transistor 224 of SRAM state latch circuit 201D. Other configurations of transistors, number of transistors or transistor types of clock circuit 200 are within the scope of the present disclosure.

Waveforms

Figure 3:
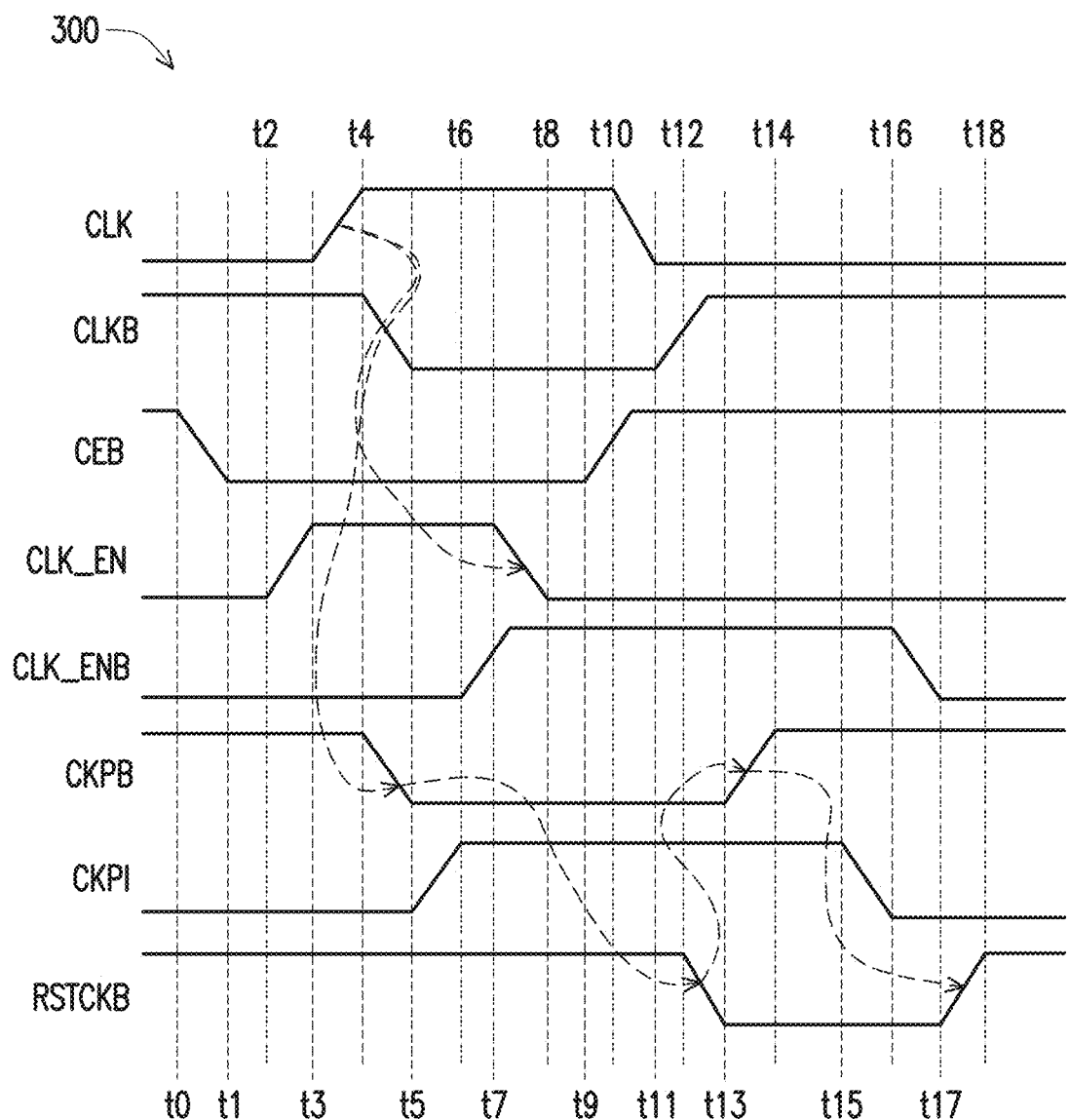
FIG. 3 is a timing diagram of various signals of a clock circuit, in accordance with some embodiments.
Figure 4:
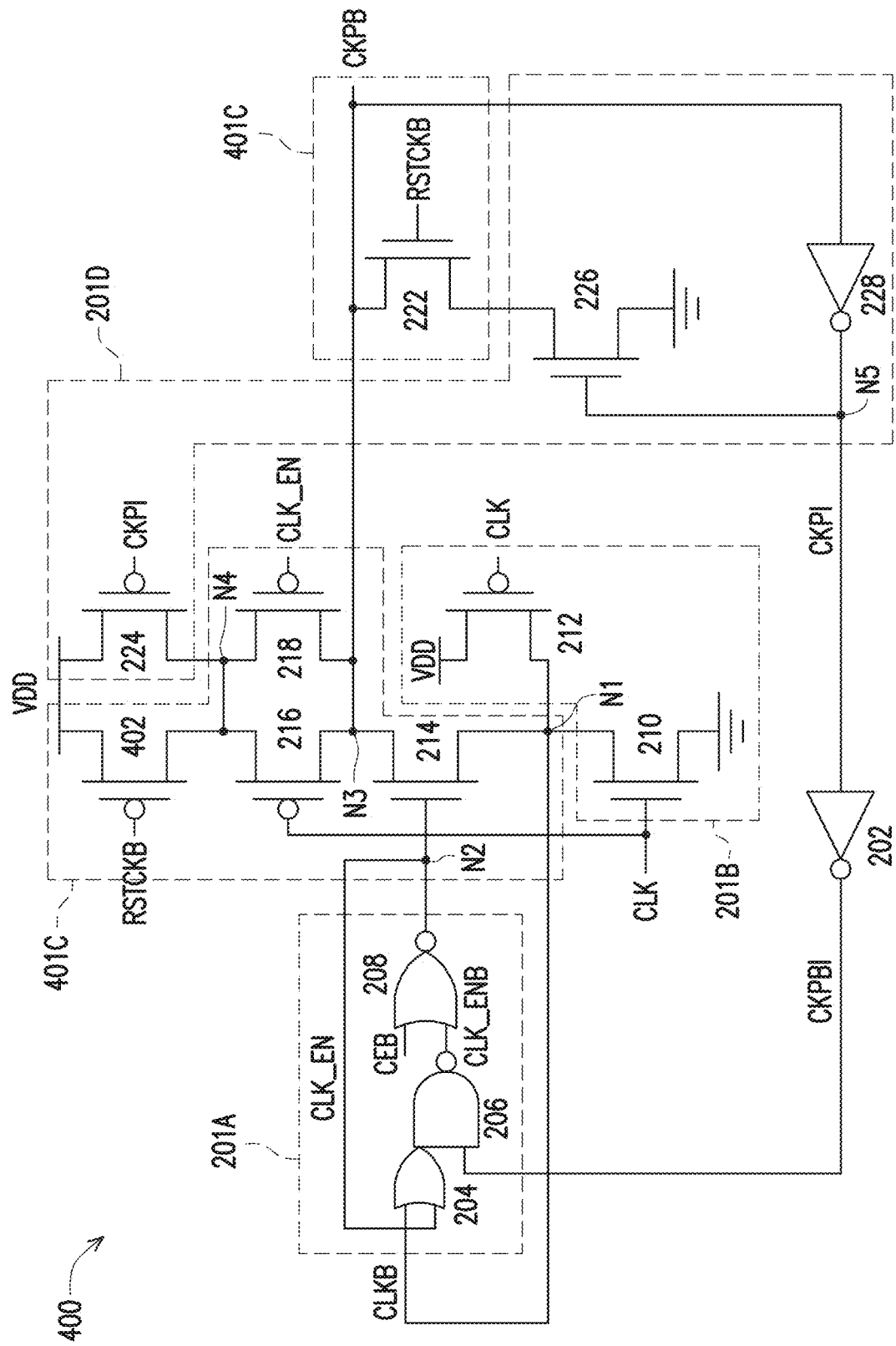
FIG. 4 is a circuit diagram of a clock circuit, in accordance with some embodiments.

FIG. 3 is a timing diagram 300 of waveforms of a clock circuit, such as clock circuit 200 in FIG. 2 or clock circuit 400 in FIG. 4, in accordance with some embodiments.

At time t0, signal CEB transitions from logically high to logically low, and signal CLK_ENB is logically low.

At time t1, signal CEB is logically low.

At time t2, in response to signal CEB transitioning to logically low, and signal CLK_ENB being logically low, signal CLK_EN, generated by NOR gate 208, transitions from logically low to logically high. In response to the transition of signal CLK_EN from logically low to logically high, NMOS transistor 214 turns on connecting node N3 to node N1, and PMOS transistor 218 turns off disconnecting node N3 from node N4. In some embodiments, signal CLK_EN corresponds to the stored or latched state of signal CEB of CEB latch 201A.

At time t3, signal CLK_EN is logically high, and signal CLK transitions from logically low to logically high.

At time t4, signal CLK is logically high, signal CLKB transitions from logically high to logically low, and signal CKPB transitions from logically high to logically low.

In response to signal CLK being logically high, NMOS transistor 210 is turned on, and PMOS transistors 212 and 216 are turned off. By causing NMOS transistor 210 to turn on pulls node N1 towards VSS, and causes signal CLKB to transition from logically high to logically low. However, since node N1 is connected to node N3 through NMOS transistor 214, by causing NMOS transistor 210 to turn on also pulls node N3 towards VSS, which causes signal CKPB to transition from logically high to logically low.

At time t5, signal CLKB is logically low, and signal CKPB is logically low. In response to signal CKPB being logically low, signal CKPI transitions from logically low to logically high by inverter 228.

At time t6, signal CKPI is logically high, and signal CLK_ENB transitions from logically low to logically high. In response to signal CKPB being logically low, inverter 228 causes signal CKPI to be logically high by inverting signal CKPB, which causes NMOS transistor 226 to turn on. However, NMOS transistor 222 is already turned on by signal RSTCKB being logically high. Therefore, by causing NMOS transistor 226 to turn on, NMOS transistor 226 and NMOS transistor 222 reinforce signal CKPB to remain logically low, which reinforces signal CKPI to be logically high.

At time t7, in response to signal CLK_ENB transitioning to logically high causes signal CLK_EN to transition from logically high to logically low. In other words, NOR gate 208 outputs a logically low signal (CLK_EN) in response to signal CLK_ENB transitioning to logically high and signal CEB being logically low.

At time t8, signal CLK_EN is logically low. In response to signal CLK_EN being logically low, NMOS transistor 214 is turned off disconnecting node N3 from node N1, and PMOS transistor 218 is turned on connecting node N3 to node N4.

At time t9, signal CEB transitions from logically low to logically high.

At time t10, signal CLK transitions from logically high to logically low. In response to the transition of signal CLK from logically high to logically low, NMOS transistor 210 begins to turn off, and PMOS transistors 212 and 216 begin to turn on.

At time t11, signal CLK is logically low, signal CEB is logically high, and signal CLKB transitions from logically low to logically high. In response to signal CLK being logically low, NMOS transistor 210 is turned off, and PMOS transistors 212 and 216 are turned on. By causing PMOS transistor 212 to turn on, node N1 is pulled towards supply voltage VDD, and signal CLKB transitions from logically low to logically high. By PMOS transistor 216 turning on, node N3 is connected to node N4 through PMOS transistor 216.

At time t12, signal RSTCKB transitions from logically high to logically low. In response to the transition of signal RSTCKB from logically high to logically low, NMOS transistor 222 begins to turn off and PMOS transistor 220 begins to turn on.

At time t13, signal RSTCKB is logically low, signal CLKB is logically high, and signal CKPB transitions from logically low to logically high. In response to signal RSTCKB being logically low, NMOS transistor 222 is turned off thus causing NMOS transistor 226 to be disconnected from node N3 through NMOS transistor 222. In response to signal RSTCKB being logically low, PMOS transistor 220 is turned on pulling node N3 towards supply voltage VDD causing signal CKPB to transition from logically low to logically high. In other words, SRAM state latch circuit 201D is reset to logically high by signal RSTCKB.

At time t14, signal CKPB is logically high.

At time t15, in response to signal CKPB being logically high at time t14, inverter 228 causes signal CKPI to transition from logically high to logically low by inverting signal CKPB.

At time t16, signal CKPI is logically low, and signal CLK_ENB transitions from logically high to logically low. In response to signal CKPI being logically low, PMOS transistor 224 is turned on, and NMOS transistor 226 is turned off. By causing PMOS transistor 224 to turn on, node N4 is pulled towards supply voltage VDD. However, node N4 is coupled to node N3 through PMOS transistor 218 and PMOS transistor 216. Thus, PMOS transistor 224, in addition to PMOS transistor 220, pulls node N3 towards supply voltage VDD. In other words, PMOS transistor 224 reinforces signal CKPB to remain logically high.

At time t17, signal CLK_ENB is logically low, and signal RSTCKB transitions from logically low to logically high in response to the signal CKPI being logically low. By causing signal RSTCKB to transition from logically low to logically high, PMOS transistor 220 is turned off, and NMOS transistor 222 is turned on. However, node N3 and signal CKPB are maintained at supply voltage VDD through one or more of PMOS transistor 216, 218 and 224, and NMOS transistor 226 is turned off and does not pull node N3 to VSS.

At time t18, signal RSTCKB is logically high and signal CKPB is logically high.

Clock Circuit

FIG. 4 is a circuit diagram of a clock circuit 400, in accordance with some embodiments.

Clock circuit 400 is a variation of clock circuit 200 of FIG. 2, and similar detailed description is therefore omitted. In comparison with clock circuit 200 of FIG. 2, SRAM state trigger circuit 401C replaces SRAM state trigger circuit 201C.

In some embodiments, clock circuit 400 is a static clock generating circuit. Clock circuit 400 is an embodiment of the clock circuit 101 of FIG. 1.

In comparison with clock circuit 200 of FIG. 2, PMOS transistor 402 of clock circuit 400 replaces PMOS transistor 220 at a different location. In other words, PMOS transistor 402 is similar to PMOS transistor 220, but is positioned in a different location. For example, PMOS transistor 402 is coupled in parallel with PMOS transistor 224 between supply voltage VDD and node N4. By positioning PMOS transistor 402 to be coupled to node N4 causes node N3 to not float when PMOS transistor 402 and NMOS transistor 222 switch on or off resulting in a static logic type clock circuit.

A gate terminal of PMOS transistor 402 is configured to receive signal RSTCKB. PMOS transistor 402 is turned on or off based on signal RSTCKB. In some embodiments, the gate of PMOS transistor 402 is coupled with the gate of NMOS transistor 222. A source terminal of PMOS transistor 402 is coupled with supply voltage VDD. In some embodiments, the source terminal of PMOS transistor 402 is coupled with the source terminal of PMOS transistor 224.

Each of a drain terminal of PMOS transistor 402, the source terminal of PMOS transistor 216, the source terminal of PMOS transistor 218 and the drain terminal of PMOS transistor 224 are coupled to each other at node N4.

By not including PMOS transistor 220, node N3 of clock circuit 400 is not pulled toward supply voltage VDD based on only signal RSTCKB. For example, PMOS transistor 402 is coupled to node N3 by either PMOS transistor 218 or PMOS transistor 216 which are driven by corresponding signal CLK_EN or signal CLK. Thus, PMOS transistor 402 and either PMOS transistor 218 or PMOS transistor 216 are configured to pull node N3 toward supply voltage VDD based on signal RSTCKB and either signal CLK_EN or signal CLK, respectively.

The timing diagram 300 of waveforms apply to clock circuit 200 of FIG. 2 as well as clock circuit 400, and similar detailed description is therefore omitted. However, some of the operation of PMOS transistor 402 is different from PMOS transistor 220, and is therefore described below. For brevity, detailed description of similar operation of clock circuit 400 and clock circuit 200 is therefore omitted.

At time t12, signal RSTCKB transitions from logically high to logically low. In response to the transition of signal RSTCKB from logically high to logically low, NMOS transistor 222 begins to turn off and PMOS transistor 402 begins to turn on.

At time t13, signal RSTCKB is logically low, signal CLKB is logically high, and signal CKPB transitions from logically low to logically high. In response to signal RSTCKB being logically low, NMOS transistor 222 is turned off thus causing NMOS transistor 226 to be disconnected from node N3 through NMOS transistor 222. In response to signal RSTCKB being logically low, PMOS transistor 402 is turned on connecting node N4 to node N3 through PMOS transistor 216 and PMOS transistor 218. Thus, PMOS transistor 402 pulls node N3 towards supply voltage VDD through node N4 causing signal CKPB to transition from logically low to logically high. In other words, SRAM state latch circuit 201D of FIG. 4 is reset to logically high by signal RSTCKB.

At time t14, signal CKPB is logically high.

At time t15, in response to signal CKPB being logically high at time t14, inverter 228 causes signal CKPI to transition from logically high to logically low by inverting signal CKPB.

At time t16, signal CKPI is logically low, and signal CLK_ENB transitions from logically high to logically low. In response to signal CKPI being logically low, PMOS transistor 224 is turned on, and NMOS transistor 226 is turned off. By causing PMOS transistor 224 to turn on, PMOS transistor 224 also pulls node N4 towards supply voltage VDD. Thus, an additional path to pull node N4 and N3 towards supply voltage VDD is created by turning on PMOS transistor 224. In other words, PMOS transistor 224 reinforces signal CKPB to remain logically high.

At time t17, signal CLK_ENB is logically low, and signal RSTCKB transitions from logically low to logically high in response to the signal CKPI being logically low. By causing signal RSTCKB to transition from logically low to logically high, PMOS transistor 402 is turned off, and NMOS transistor 222 is turned on. However, node N3 and signal CKPB are maintained at supply voltage VDD through one or more of PMOS transistor 216, 218 and 224, and NMOS transistor 226 is turned off and does not pull node N3 to VSS.

At time t18, signal RSTCKB is logically high and signal CKPB is logically high.

Figure 5:
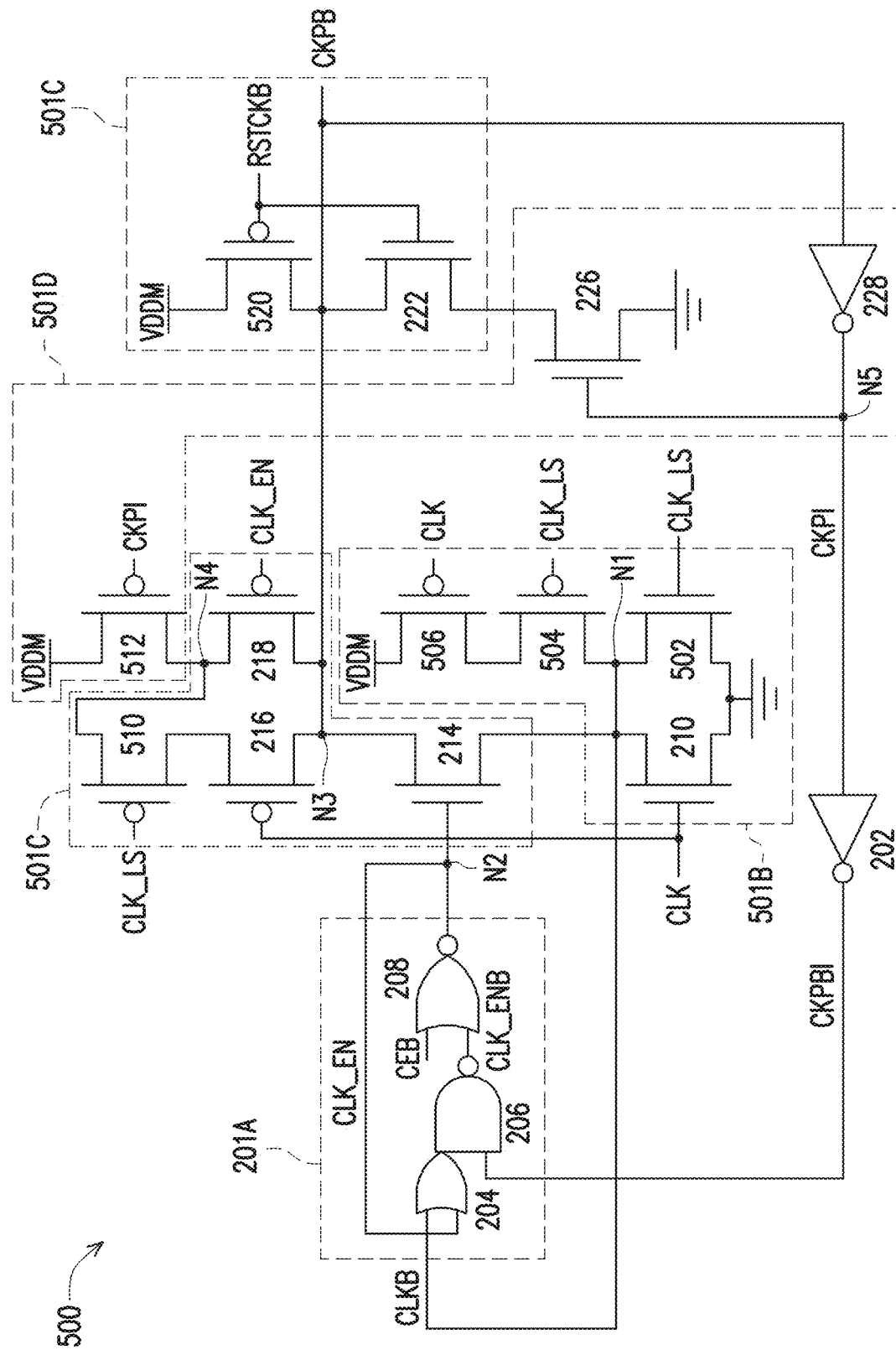
FIG. 5 is a timing diagram of various signals of a clock circuit, in accordance with some embodiments.

FIG. 5 is a circuit diagram of a clock circuit 500, in accordance with some embodiments.

Clock circuit 500 is a dual-rail circuit implementation using clock signals (e.g., signal CLK and signal CLK_LS) of two different voltage domains. For example, in some embodiments, signal CLK is a clock signal of a low voltage domain, and signal CLK_LS is a clock signal of a high voltage domain. In some embodiments, clock circuit 500 is further implemented with a clock level shifter (e.g., level shifter circuit 600) for a dual-rail memory design.

Clock circuit 500 is a variation of clock circuit 200 of FIG. 2, and similar detailed description is therefore omitted. In comparison with clock circuit 200 of FIG. 2, clock trigger circuit 501B replaces clock trigger circuit 201B, SRAM state trigger circuit 501C replaces SRAM state trigger circuit 201C, SRAM state latch circuit 501D replaces SRAM state latch circuit 201D. In comparison with clock circuit 200 of FIG. 2, clock circuit 500 does not include PMOS transistor 212, PMOS transistor 224 and PMOS transistor 220, but clock circuit 500 further includes an NMOS transistor 502, a PMOS transistor 504, a PMOS transistor 506, a PMOS transistor 510, a PMOS transistor 512 and PMOS transistor 520. Clock circuit 500 is an embodiment of clock circuit 101 of FIG. 1.

A gate terminal of NMOS transistor 502 is configured to receive a signal CLK_LS. In some embodiments, signal CLK_LS is generated by a level shifter circuit, such as level shifter circuit 600 of FIG. 6. NMOS transistor 502 is turned on or off based on signal CLK_LS. A source terminal of NMOS transistor 502 is coupled to the supply reference voltage VSS. The source terminal of NMOS transistor 502 is coupled with the source terminal of NMOS transistor 210. Each of a drain terminal of NMOS transistor 502, a drain terminal of PMOS transistor 504, the drain terminal of NMOS transistor 210, the source terminal of NMOS transistor 214, and the first input terminal of OR gate 204 are coupled to each other at node N1.

A gate terminal of PMOS transistor 504 is configured to receive signal CLK_LS. PMOS transistor 504 is turned on or off based on signal CLK_LS. A source terminal of PMOS transistor 504 is coupled to a drain terminal of PMOS transistor 506.

A gate terminal of PMOS transistor 506 is configured to receive signal CLK. PMOS transistor 506 is turned on or off based on signal CLK. A source terminal of PMOS transistor 506 is coupled to supply voltage VDDM. In some embodiments, supply voltage VDDM is greater than supply voltage VDD. In some embodiments, supply voltage VDDM is less than supply voltage VDD. In some embodiments, supply voltage VDDM has a voltage swing ranging from VDDM to VSS. In some embodiments, supply voltage VDD has a voltage swing ranging from VDD to VSS.

Together NMOS transistor 210, NMOS transistor 502, PMOS transistor 504 and PMOS transistor 506 are configured to set the voltage of node N1. The voltage of node N1 corresponds to signal CLKB.

In comparison with clock circuit 200 of FIG. 2, PMOS transistor 510 of FIG. 5 is inserted between the source terminal of PMOS transistor 216 and node N4, and therefore the source terminal of PMOS transistor 216 is not directly coupled to node N4. A gate terminal of PMOS transistor 510 is configured to receive signal CLK_LS. PMOS transistor 510 is turned on or off based on signal CLK_LS. A drain terminal of PMOS transistor 510 is coupled to the source terminal of PMOS transistor 216. Each of a source terminal of PMOS transistor 510, a drain terminal of PMOS transistor 512, and the source terminal of PMOS transistor 218 are coupled to each other at node N4.

PMOS transistor 512 replaces PMOS transistor 224 of clock circuit 200 of FIG. 2. A source terminal of PMOS transistor 512 is coupled to supply voltage VDDM. A gate terminal of PMOS transistor 512 is configured to receive signal CKPI. PMOS transistor 512 is turned on or off based on signal CKPI. In some embodiments, the gate terminal of PMOS transistor 512 is coupled to node N5.

PMOS transistor 520 replaces PMOS transistor 220 of clock circuit 200 of FIG. 2. A source terminal of PMOS transistor 512 is coupled to supply voltage VDDM. A gate terminal of PMOS transistor 520 is configured to receive signal RSTCKB. PMOS transistor 520 is turned on or off based on signal RSTCKB. The gate terminal of PMOS transistor 520 is coupled with the gate terminal of NMOS transistor 222. In some embodiments, the gate terminal of PMOS transistor 512 is coupled to node N5. Each of a drain terminal of PMOS transistor 520, the drain terminal of NMOS transistor 214, the drain terminal of PMOS transistor 216, the drain terminal of PMOS transistor 218, the drain terminal of NMOS transistor 222, and the input terminal of inverter 228 are coupled together at node N3. In some embodiments, by positioning PMOS transistor 520 in the present location, when PMOS transistor 520 and NMOS transistor 222 switch on or off causes node N3 to float resulting in a dynamic logic type clock circuit.

In some embodiments, by using the dual-rail memory design of clock circuit 500, clock circuit 500 has a larger range of operating voltages compared with other approaches.

Level Shifter Circuit

Figure 6:
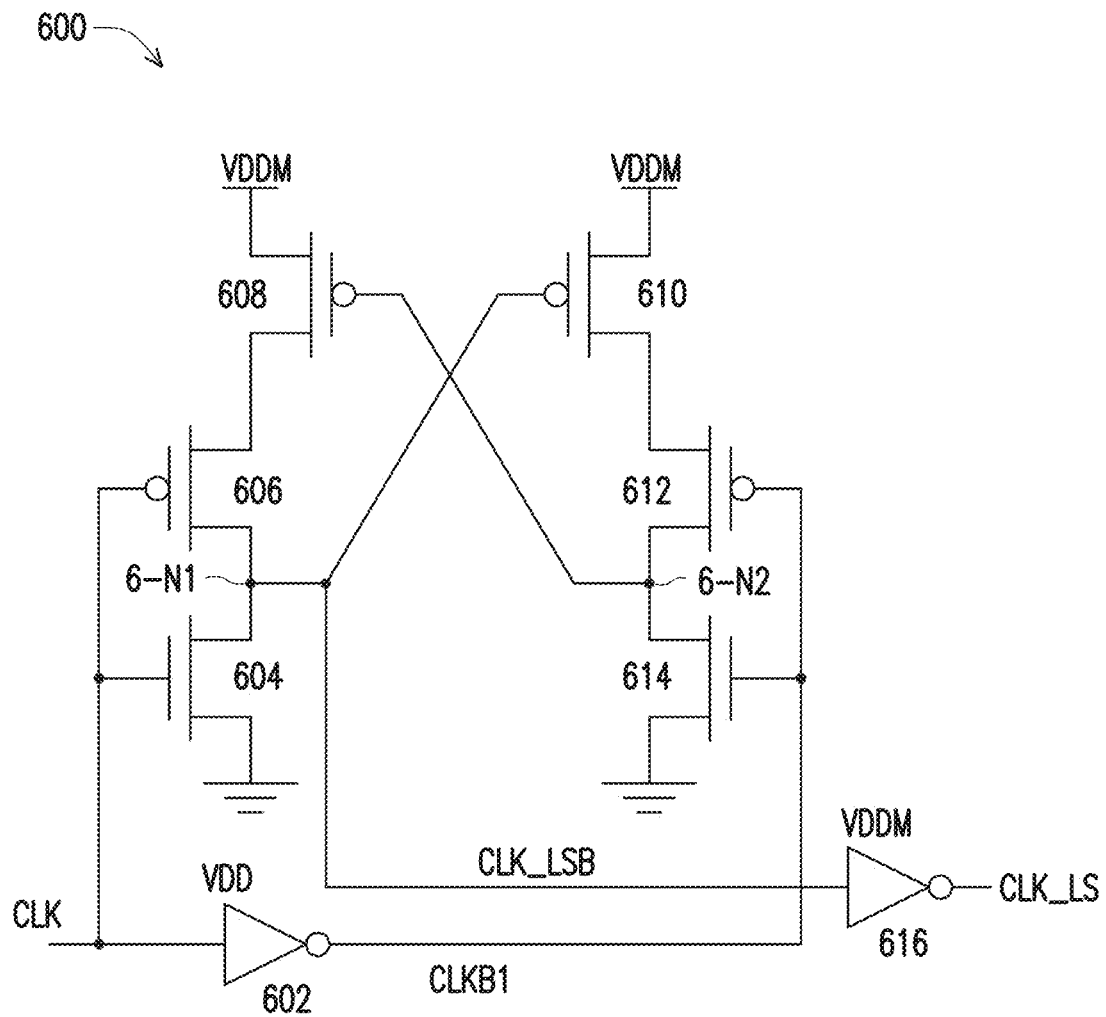
FIG. 6 is a circuit diagram of a level shifter circuit, in accordance with some embodiments.

FIG. 6 is a circuit diagram of a level shifter circuit 600, in accordance with some embodiments.

Level shifter circuit 600 is usable with one or more of clock circuit 101 of FIG. 1, clock circuit 500 of FIG. 5 or clock circuit 800 of FIG. 8 (described below). For example, in some embodiments, level shifter circuit 600 is coupled to NMOS transistor 502, PMOS transistor 504 and PMOS transistor 510 of clock circuit 500 or 800, and level shifter circuit 600 is configured to output signal CLK_LS to NMOS transistor 502, PMOS transistor 504 and PMOS transistor 510 of clock circuit 500 or 800.

Figure 7:
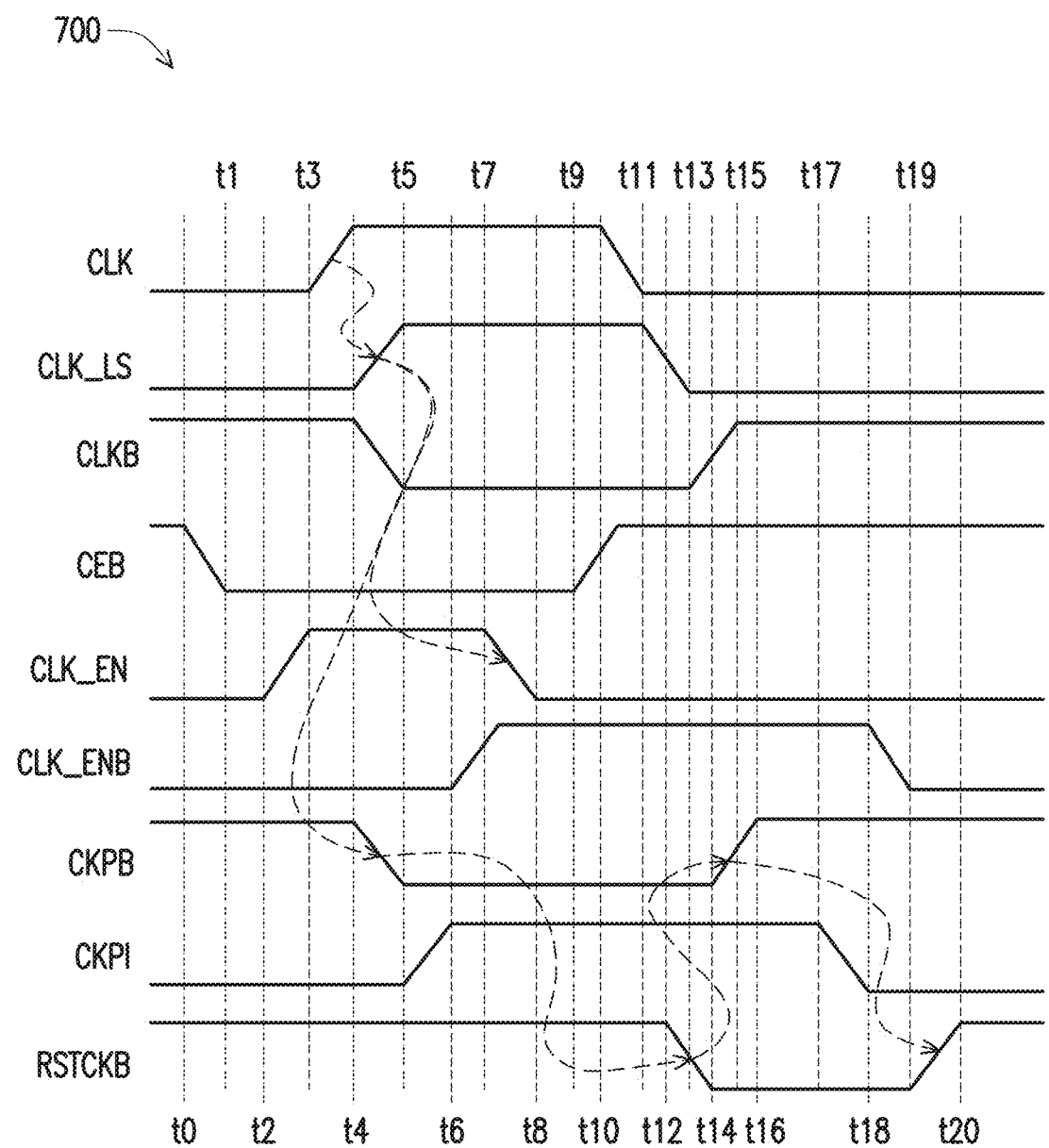
FIG. 7 is a timing diagram of various signals of a clock circuit, in accordance with some embodiments.
Figure 8:
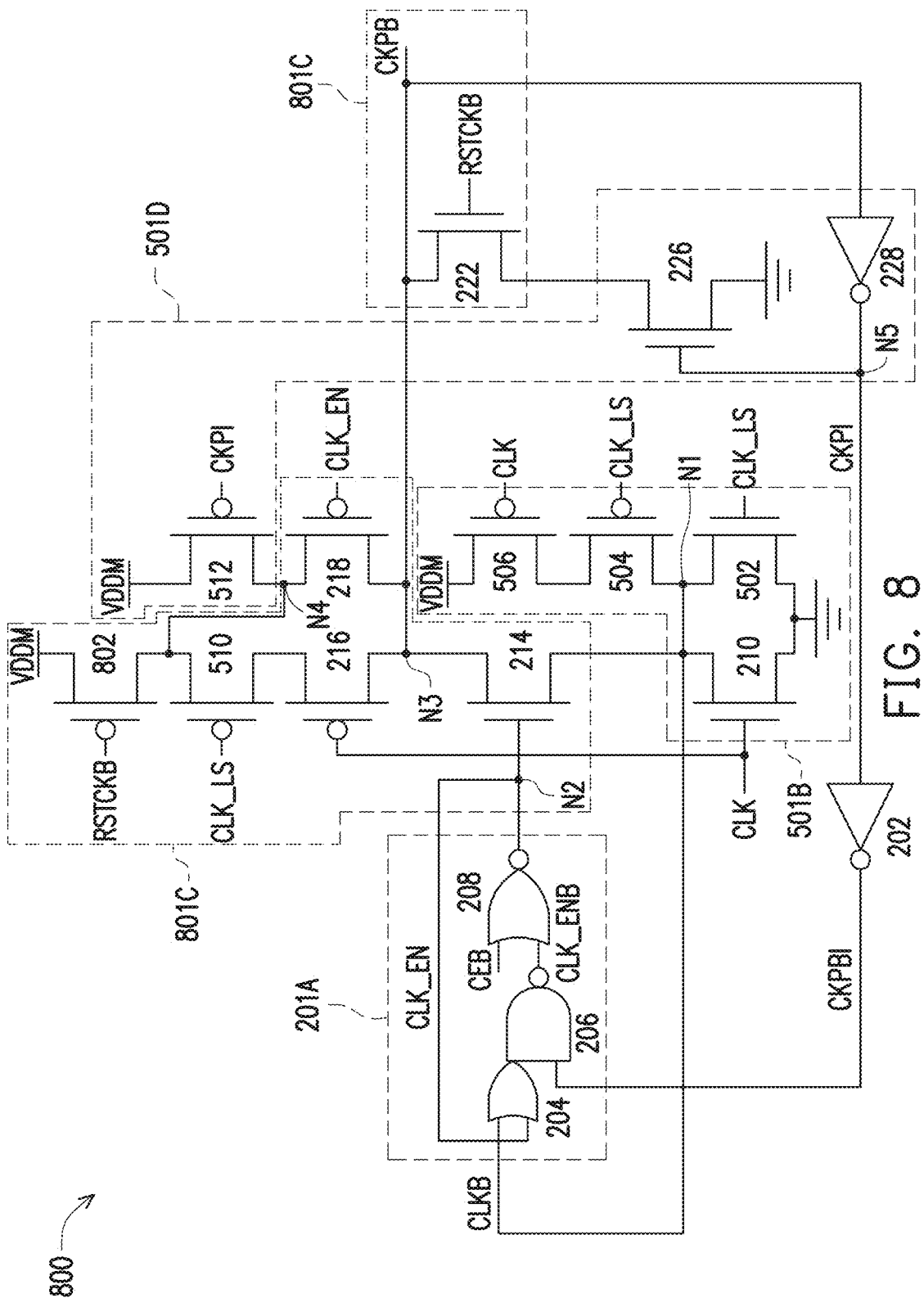
FIG. 8 is a circuit diagram of a clock circuit, in accordance with some embodiments.

In some embodiments, clock circuit 500 of FIG. 5 or clock circuit 800 of FIG. 8 is further implemented with a clock level shifter (e.g., level shifter circuit 600) for a dual-rail memory design. In some embodiments, level shifter circuit 600 is useable to generate signal CLK_LS (FIGS. 5, 7 and 8).

Level shifter circuit 600 is a clock level shifter circuit configured to shift clock signals from a low voltage domain that uses a supply voltage VDD to a high voltage domain that uses a supply voltage VDDM.

Level shifter circuit 600 is configured to receive signal CLK on an input terminal (not labelled), and to output a signal CLK_LS on an output terminal (not labeled). Signal CLK corresponds to an input signal of level shifter circuit 600, and signal CLK_LS corresponds to an output signal of level shifter circuit 600. Level shifter circuit 600 is configured to generate signal CLK_LS based on signal CLK.

Signal CLK_LS corresponds to a level shifted version of signal CLK. In some embodiments, a voltage level of signal CLK of level shifter circuit 600 is less than a voltage level of the signal CLK_LS of level shifter circuit 600. In some embodiments, the voltage level of signal CLK of level shifter circuit 600 is greater than the voltage level of signal CLK_LS of level shifter circuit 600.

Level shifter circuit 600 includes an inverter 602, an NMOS transistor 604, a PMOS transistor 606, a PMOS transistor 608, a PMOS transistor 610, a PMOS transistor 612, an NMOS transistor 614 and an inverter 616.

An input terminal of inverter 602 is configured to receive a signal CLK. Each of the input terminal of inverter 602, a gate terminal of PMOS transistor 606, and a gate terminal of NMOS transistor 604 are coupled to each other. An output terminal of inverter 602 is configured to output a signal CLKB1. In some embodiments, signal CLKB1 is an inverted version of signal CLK. Inverter 602 is configured to generate signal CLKB1 based on signal CKPI. In some embodiments, signal CLKB1 corresponds to signal CLKB of FIGS. 1-5 and 7-8. Inverter 602 is coupled to supply voltage VDD. In some embodiments, inverter 602 is a CMOS inverter type coupled to supply voltage VDD and reference voltage VSS.

The gate terminal of NMOS transistor 604 is configured to receive clock signal CLK. A source terminal of NMOS transistor 604 is coupled to supply reference voltage VSS. Each of a drain terminal of NMOS transistor 604, a drain terminal of PMOS transistor 606, a gate terminal of PMOS transistor 610, and an input terminal of inverter 616 are coupled together at a node 6-N1.

The gate terminal of PMOS transistor 606 is configured to receive clock signal CLK. A source terminal of PMOS transistor 606 is coupled to the drain terminal of PMOS transistor 608.

A source terminal of PMOS transistor 608 is coupled with supply voltage VDDM. Each of a gate terminal of PMOS transistor 608, a drain terminal of NMOS transistor 614, and a drain terminal of PMOS transistor 612 are coupled to each other at a node 6-N2. The gate terminal of PMOS transistor 608 is configured to receive a voltage at node 6-N2. In some embodiments, PMOS transistor 608 is turned on or off based on the voltage at node 6-N2.

NMOS transistor 604, PMOS transistor 606 and PMOS transistor 608 are configured to set the voltage of node 6-N1 which corresponds to signal CLK_LSB. For example, in some embodiments, if NMOS transistor 604 is turned on, NMOS transistor 604 is configured to pull node 6-N1 towards reference voltage VSS. For example, in some embodiments, if PMOS transistors 606 and 608 are turned on, PMOS transistors 606 and 608 are configured to pull node 6-N1 towards supply voltage VDDM.

A source terminal of PMOS transistor 610 is coupled with supply voltage VDDM. A drain terminal of PMOS transistor 610 is coupled with a source terminal of PMOS transistor 612. The gate terminal of PMOS transistor 610 is coupled to at least node 6-N1. A voltage at node 6-N1 corresponds to a signal CLK_LSB. The gate terminal of PMOS transistor 610 is configured to receive signal CLK_LSB. In some embodiments, PMOS transistor 610 is turned on or off based on the voltage at node 6-N1 which corresponds to signal CLK_LSB.

The gate terminal of PMOS transistor 612 is configured to receive signal CLKB1 from inverter 602. Each of the gate terminal of PMOS transistor 612, a gate terminal of NMOS transistor 614 and the output terminal of inverter 602 are coupled to each other.

The gate terminal of NMOS transistor 614 is configured to receive signal CLKB1 from inverter 602. A source terminal of NMOS transistor 614 is coupled to supply reference voltage VSS.

NMOS transistor 614, PMOS transistor 610 and PMOS transistor 612 are configured to set the voltage of node 6-N2. For example, in some embodiments, if NMOS transistor 614 is turned on, NMOS transistor 614 is configured to pull node 6-N2 towards reference voltage VSS. For example, in some embodiments, if PMOS transistors 610 and 612 are turned on, PMOS transistors 610 and 612 are configured to pull node 6-N2 towards supply voltage VDDM.

The input terminal of inverter 616 is configured to receive signal CLK_LSB from node 6-N1. An output terminal of inverter 616 is configured to output signal CLK_LS. In some embodiments, signal CLK_LS is an inverted version of signal CLK_LSB. Inverter 616 is configured to generate signal CLK_LS based on signal CLK_LSB. Inverter 616 is coupled to supply voltage VDDM. In some embodiments, inverter 616 is a CMOS inverter type coupled to supply voltage VDDM and reference voltage VSS. Signal CLK_LS corresponds to the output signal of level shifter circuit 600. Signal CLK_LS is a level shifted version of signal CLK. For example, signal CLK_LS a high voltage domain clock signal that uses supply voltage VDDM, and signal CLK is a low voltage domain clock signal that uses supply voltage VDD.

FIG. 7 is a timing diagram 700 of waveforms of a clock circuit, such as clock circuit 500 in FIG. 5 or clock circuit 800 in FIG. 8, in accordance with some embodiments.

At time t0, signal CEB transitions from logically high to logically low.

At time t1, signal CEB is logically low.

At time t2, in response to signal CEB transitioning to logically low, and signal CLK_ENB being logically low, signal CLK_EN, generated by NOR gate 208, transitions from logically low to logically high. In response to the transition of signal CLK_EN from logically low to logically high, NMOS transistor 214 turns on connecting node N3 to node N1, and PMOS transistor 218 turns off disconnecting node N3 from node N4. In some embodiments, signal CLK_EN corresponds to the stored or latched state of signal CEB of CEB latch 201A.

At time t3, signal CLK_EN is logically high, and signal CLK transitions from logically low to logically high. In response to the transition of signal CLK from logically low to logically high, NMOS transistor 210 is turned on, and PMOS transistors 606 and 216 are turned off. By turning on NMOS transistor 210, NMOS transistor 210 pulls node N1 towards VSS, resulting in signal CLKB transitioning from logically high to logically low.

At time t4, signal CLK is logically high, signal CLK_LS transitions from logically low to a second logically high level (e.g., supply voltage VDDM), signal CLKB transitions from logically high to logically low, and signal CKPB transitions from the second logically high level (e.g., supply voltage VDDM) to logically low.

In response to the transition of signal CLK_LS from logically low to the second logically high level (e.g., supply voltage VDDM), NMOS transistor 502 is turned on, and PMOS transistors 604 and 610 are turned off. By turning on NMOS transistor 502, NMOS transistor 502 assists NMOS transistor 210 to pull node N1 towards VSS, thus causing signal CLKB to transition from logically high to logically low.

In response to signal CLK being logically high, NMOS transistor 210 is turned on and pulls node N3 towards reference voltage VSS, which causes signal CKPB to transition from the second logically high level (e.g., supply voltage VDDM) to logically low.

At time t5, signal CLKB is logically low, signal CLK_LS is at the second logically high level and signal CKPB is logically low. In response to signal CKPB being logically low, signal CKPI transitions from logically low to the second logically high level by inverter 228.

At time t6, signal CKPI is at the second logically high level, and signal CLK_ENB transitions from logically low to logically high. In response to signal CKPB being logically low, inverter 228 causes signal CKPI to be at the second logically high level by inverting signal CKPB, which causes NMOS transistor 226 to turn on. However, NMOS transistor 222 is already turned on by signal RSTCKB being at the second logically high level. Therefore, by causing NMOS transistor 226 to turn on, NMOS transistor 226 and NMOS transistor 222 reinforce signal CKPB to remain logically low, which reinforces signal CKPI to be at the second logically high level.

At time t7, in response to signal CLK_ENB transitioning to logically high causes signal CLK_EN to transition from logically high to logically low. In other words, NOR gate 208 outputs a logically low signal (CLK_EN) in response to signal CLK_ENB transitioning to logically high and signal CEB being logically low.

At time t8, signal CLK_EN is logically low. In response to signal CLK_EN being logically low, NMOS transistor 214 is turned off disconnecting node N3 from node N1, and PMOS transistor 218 is turned on connecting node N3 to node N4.

At time t9, signal CEB transitions from logically low to logically high.

At time t10, signal CLK transitions from logically high to logically low. In response to the transition of signal CLK from logically high to logically low, NMOS transistor 210 begins to turn off, and PMOS transistors 506 and 216 begin to turn on. By turning on PMOS transistor 216, node N3 is connected to node N4.

At time t11, signal CLK is logically low, and CLK_LS transitions from the second logically high level to logically low. In response to signal CLK being logically low, NMOS transistor 210 is turned off, and PMOS transistors 506 and 216 are turned on. In response to the transition of signal CLK_LS from the second logically high level (e.g., supply voltage VDDM) to logically low, NMOS transistor 502 begins to turn off, and PMOS transistors 604 and 610 begin to turn on. By turning on PMOS transistor 506, PMOS transistor 506 and PMOS transistor 504 begin to pull node N1 towards supply voltage VDDM.

At time t12, signal RSTCKB transitions from the second logically high level to logically low. In response to the transition of signal RSTCKB from the second logically high level to logically low, NMOS transistor 222 is turned off thus causing NMOS transistor 222 to be disconnected from node N3. In response to the transition of signal RSTCKB from the second logically high level to logically low, PMOS transistor 520 is turned on. As PMOS transistor 520 is turned on, PMOS transistor 520 pulls node N3 toward supply voltage VDDM.

At time t13, signal CLK_LS is logically low causing NMOS transistor 502 to turn off, and PMOS transistors 504 and 510 to turn on thereby causing signal CLKB to transition from logically low to the second logically high level (e.g., supply voltage VDDM). For example, by turning on PMOS transistors 504 and 510, PMOS transistor 504 assists PMOS transistor 506 to pull node N1 towards supply voltage VDDM, thus causing signal CLKB to transition from logically low to the second logically high level. By PMOS transistors 216 and 510 turning on, node N3 is connected to node N4 through PMOS transistors 216 and 510.

At time t14, signal RSTCKB is logically low, and signal CKPB transitions from logically low to the second logically high level. In response to signal RSTCKB being logically low, NMOS transistor 222 is turned off thus causing NMOS transistor 226 to be disconnected from node N3 through NMOS transistor 222. In response to signal RSTCKB being logically low, PMOS transistor 520 is turned on pulling node N3 towards supply voltage VDDM causing signal CKPB to transition from logically low to the second logically high level. In other words, SRAM state latch circuit 501D is reset to the second logically high level by signal RSTCKB.

At time t15, signal CLKB is logically high.

At time t16, signal CKPB is at the second logically high level.

At time t17, in response to signal CKPB being at the second logically high level, signal CKPI transitions from the second logically high level to logically low.

At time t18, signal CKPI is logically low, and signal CLK_ENB transitions from logically high to logically low. In response to signal CKPI being logically low, PMOS transistor 512 is turned on, and NMOS transistor 226 is turned off. By causing PMOS transistor 512 to turn on, node N4 is pulled towards supply voltage VDD. However, node N4 is coupled to node N3 through two paths; through PMOS transistor 218 and through PMOS transistors 216 and 510. Thus, PMOS transistors 216, 510, 218 and 512, in addition to PMOS transistor 520, pull node N3 towards supply voltage VDDM. In other words, PMOS transistor 520 reinforces signal CKPB to remain at the second logically high level.

At time t19, signal CLK_ENB is logically low, and signal RSTCKB transitions from logically low to the second logically high level in response to signal CKPI being logically low. By causing signal RSTCKB to transition from logically low to the second logically high level, PMOS transistor 520 is turned off, and NMOS transistor 222 is turned on. However, node N3 and signal CKPB are maintained at supply voltage VDDM through one or more of PMOS transistor 216, 510, 218 and 512, and NMOS transistor 226 is turned off and does not pull node N3 to VSS.

At time t20, signal RSTCKB is at the second logically high level (e.g., supply voltage VDDM) and signal CKPB is at the second logically high level.

Clock Circuit

FIG. 8 is a circuit diagram of a clock circuit 800, in accordance with some embodiments.

Clock circuit 800 is a variation of clock circuit 400 of FIG. 4 and clock circuit 500 of FIG. 5, and similar detailed description is therefore omitted. In other words, clock circuit 800 combines the features of clock circuit 400 and clock circuit 500. For example, clock circuit 800 utilizes the static clock circuit 400 of FIG. 4 combined with the level shifter features of clock circuit 500 of FIG. 5. In comparison with clock circuit 500 of FIG. 5, SRAM state trigger circuit 801C replaces SRAM state trigger circuit 501C.

Clock circuit 800 is a static, dual-rail circuit implementation using clock signals (e.g., signal CLK and signal CLK_LS) of two different voltage domains. In some embodiments, clock circuit 800 is further implemented with a clock level shifter (e.g., level shifter circuit 600) for a dual-rail memory design. Clock circuit 800 is an embodiment of the clock circuit 101 of FIG. 1.

In comparison with clock circuit 500 of FIG. 5, PMOS transistor 802 of clock circuit 800 replaces PMOS transistor 520 at a different location. In other words, PMOS transistor 802 is similar to PMOS transistor 520, but is positioned in a different location. For example, PMOS transistor 802 is coupled in parallel with PMOS transistor 512 between supply voltage VDDM and node N4. By positioning PMOS transistor 802 to be coupled to node N4 causes node N3 to not float when PMOS transistor 802 and NMOS transistor 222 switch on or off resulting in a static logic type circuit.

A gate terminal of PMOS transistor 802 is configured to receive signal RSTCKB. PMOS transistor 802 is turned on or off based on signal RSTCKB. In some embodiments, the gate of PMOS transistor 802 is coupled with the gate of NMOS transistor 222. A source terminal of PMOS transistor 802 is coupled with supply voltage VDDM. In some embodiments, the source terminal of PMOS transistor 802 is coupled with the source terminal of PMOS transistor 512. Each of a drain terminal of PMOS transistor 802, the source terminal of PMOS transistor 510, the source terminal of PMOS transistor 218 and the drain terminal of PMOS transistor 512 are coupled to each other at node N4.

By not including PMOS transistor 520, node N3 of clock circuit 800 is not pulled toward supply voltage VDDM based on only signal RSTCKB. For example, PMOS transistor 802 is coupled to node N3 by either PMOS transistor 218 (which is driven by signal CLK_EN) or PMOS transistor 510 and PMOS transistor 216 (which are driven by corresponding signals CLK_LS and signal CLK). Thus, in a first configuration, PMOS transistor 802 and PMOS transistor 218 are configured to pull node N3 toward supply voltage VDDM based on signal RSTCKB and signal CLK_EN. In a second configuration, PMOS transistor 802, PMOS transistor 510 and PMOS transistor 216 are configured to pull node N3 toward supply voltage VDDM based on signal RSTCKB, signal CLK_LS and signal CLK, respectively. In some embodiments, supply voltage VDD ranges from about 0.3 volts to about 1.3 volts. In some embodiments, supply voltage VDDM ranges from about 0.3 volts to about 1.3 volts.

In some embodiments, by using the dual-rail memory design of clock circuit 800, clock circuit 800 has a larger range of operating voltages compared with other approaches.

The timing diagram 700 of waveforms apply to clock circuit 500 of FIG. 5 as well as clock circuit 800, and similar detailed description is therefore omitted. However, some of the operation of PMOS transistor 802 is different from PMOS transistor 520, and is therefore described below. For brevity, detailed description of similar operation of clock circuit 800 and clock circuit 500 is therefore omitted.

At time t12, signal RSTCKB transitions from the second logically high level (e.g., supply voltage VDDM) to logically low. In response to the transition of signal RSTCKB from the second logically high level to logically low, NMOS transistor 222 begins to turn off and PMOS transistor 802 begins to turn on.

At time t13, signal CLKB transitions from logically low to logically high.

At time t14, signal RSTCKB is logically low, and signal CKPB transitions from logically low to the second logically high level. In response to signal RSTCKB being logically low, NMOS transistor 222 is turned off thus causing NMOS transistor 226 to be disconnected from node N3 through NMOS transistor 222. In response to signal RSTCKB being logically low, PMOS transistor 802 is turned on connecting node N4 to node N3 through PMOS transistor 510, PMOS transistor 216 and PMOS transistor 218. Thus, PMOS transistor 802 pulls node N3 towards supply voltage VDD through node N4 causing signal CKPB to transition from logically low to the second logically high level. In other words, SRAM state latch circuit 801D is reset to the second logically high level by signal RSTCKB.

At time t15, signal CLKB is logically high.

At time t16, signal CKPB is at the second logically high level.

At time t17, in response to signal CKPB being at the second logically high level at time t16, inverter 228 causes signal CKPI to transition from the second logically high level to logically low by inverting signal CKPB.

At time t18, signal CKPI is logically low, and signal CLK_ENB transitions from logically high to logically low. In response to signal CKPI being logically low, PMOS transistor 512 is turned on, and NMOS transistor 226 is turned off. By causing PMOS transistor 512 to turn on, PMOS transistor 512 also pulls node N4 towards supply voltage VDDM. Thus, an additional path to pull node N4 and N3 towards supply voltage VDDM is created by turning on PMOS transistor 5112. In other words, PMOS transistor 512 reinforces signal CKPB to remain at the second logically high level.

At time t19, signal CLK_ENB is logically low, and signal RSTCKB transitions from logically low to the second logically high level in response to the signal CKPI being logically low. By causing signal RSTCKB to transition from logically low to the second logically high level, PMOS transistor 802 is turned off, and NMOS transistor 222 is turned on. However, node N3 and signal CKPB are maintained at supply voltage VDDM through one or more of PMOS transistor 216, 218, 510 and 512, and NMOS transistor 226 is turned off and does not pull node N3 to VSS.

At time t20, signal RSTCKB is at the second logically high level and signal CKPB is at the second logically high level.

Method

Figure 9A:
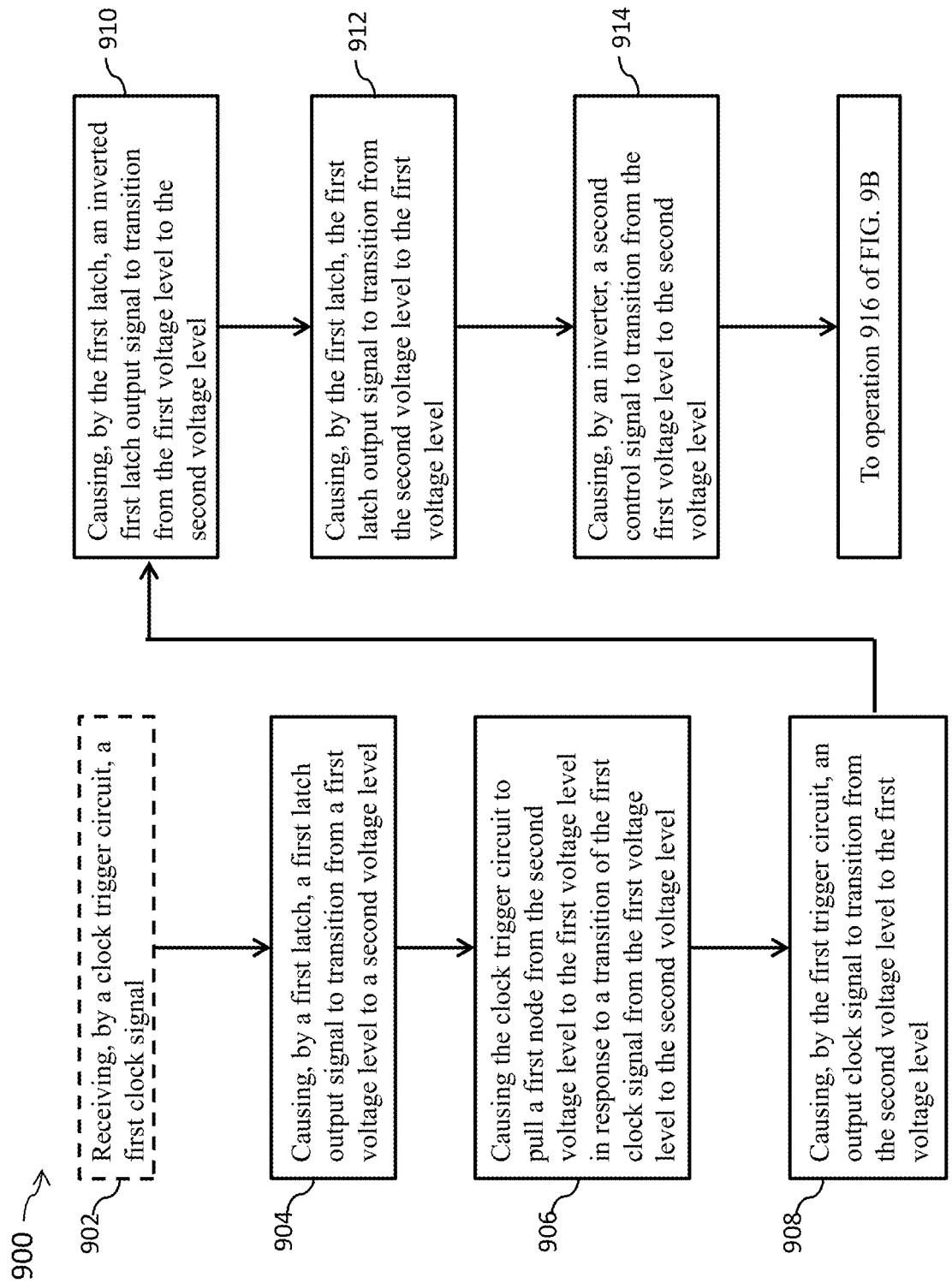
FIGS. 9A-9B is a flowchart of a method of operating a clock circuit, such as the clock circuit of FIG. 1, FIG. 2, FIG. 4, FIG. 5 or FIG. 8, in accordance with some embodiments.
Figure 9B:
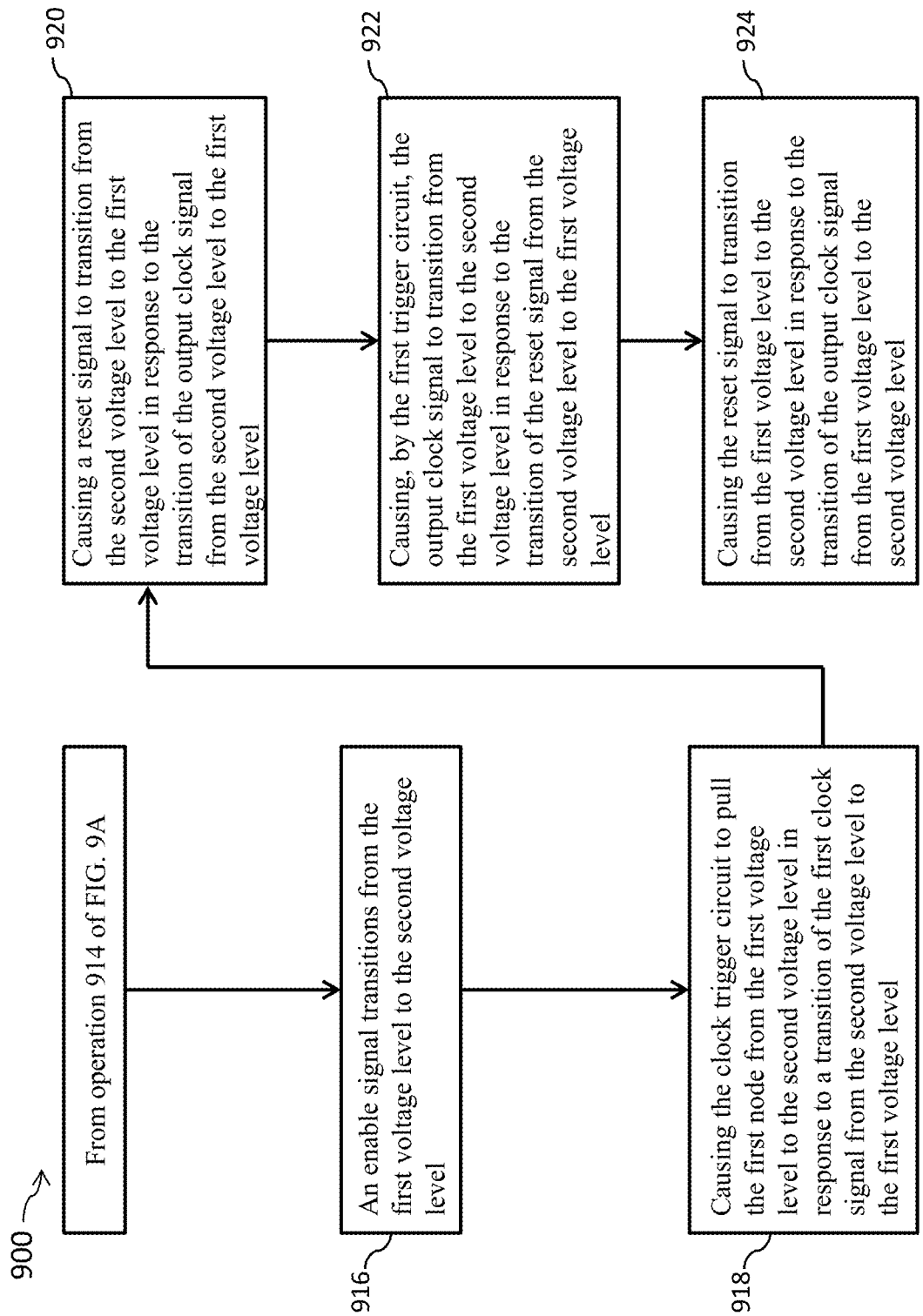

FIG. 9 is a flowchart of a method of operating a clock circuit, such as the clock circuit of FIGS. 1-2, FIG. 4-5 or FIG. 8, in accordance with some embodiments. It is understood that additional operations may be performed before, during, and/or after the method 900 depicted in FIG. 9, and that some other processes may only be briefly described herein. It is understood that method 900 utilizes features of one or more of timing diagram 300 of FIG. 3, level shifter circuit 600 of FIG. 6 or timing diagram 700 of FIG. 7.

In operation 902 of method 900, a first clock signal (CLK) is received by a clock trigger circuit 201B. In some embodiments, operation 902 further comprises receiving, by a first latch (CEB latch 201A), an enable signal (CEB).

In operation 904 of method 900, a first latch (CEB latch 201A) causes a first latch output signal (CLK_EN) to transition from a first voltage level (VSS) to a second voltage level (VDD) in response to a transition of an enable signal (signal CEB) from the second voltage level to the first voltage level. In some embodiments, the second voltage level is different from the first voltage level. In some embodiments, operation 904 is performed by NOR gate 208.

In operation 906 of method 900, the clock trigger circuit 201B pulls a first node (e.g., node N1) from the second voltage level to the first voltage level in response to a transition of the first clock signal (CLK) from the first voltage level (VSS) to the second voltage level (VDD). In some embodiments, the pulling of the first node of operation 906 thereby causes a first control signal (CLKB) of the clock trigger circuit 201B to transition from the second voltage level to the first voltage level. In some embodiments, the clock trigger circuit 201B is connected to an input of the first latch (e.g., latch circuit 201A) and a first trigger circuit (e.g., SRAM state trigger circuit 201C) by the first node (e.g., node N1). In some embodiments, the first control signal (CLKB) is fed back from the clock trigger circuit 201A to the input of the first latch (latch circuit 201A) from the first node (N1).

In some embodiments, operation 906 further includes causing NMOS transistor 210 to turn on and pull node N1 toward reference voltage VSS in response to the transition of signal CLK at time t3 (FIG. 3) from the first voltage level to the second voltage level, thereby causing signal CLKB to transition from the second voltage level to the first voltage level at time t4 (FIG. 5).

In operation 908 of method 900, the first trigger circuit (e.g., SRAM state trigger circuit 201C) causes an output clock signal (e.g., signal CKPB) to transition from the second voltage level to the first voltage level.

In some embodiments, operation 908 includes the first trigger circuit (e.g., SRAM state trigger circuit 201C) causing the output clock signal (e.g., signal CKPB) to transition from the second voltage level to the first voltage level in response to the transition of the first clock signal (CLK) to the second voltage level, and in response to the transition of the first latch output signal (CLK_EN) to the second voltage level. For example, in some embodiments, operation 908 further includes causing a first N-type transistor (e.g., NMOS transistor 214) to turn on responsive to the first latch output signal (e.g., signal CLK_EN) thereby coupling a second node (e.g., node N3) to the first node (e.g., node N1), causing a second N-type transistor (NMOS transistor 210) to turn on and pull the first node (N1) toward reference voltage VSS in response to the transition of signal CLK at time t3 (FIG. 3) from the first voltage level to the second voltage level, which also pulls the second node (N3) toward the first voltage level VSS, thereby causing signal CKPB to transition from the second voltage level to the first voltage level at time t5 (FIG. 3).

In operation 910 of method 900, the first latch (201A) causes an inverted first latch output signal (e.g., signal CLK_ENB) to transition from the first voltage level to the second voltage level in response to the transition of output clock signal (CKPB) from the second voltage level to the first voltage level. In some embodiments, operation 910 is performed by NAND gate 206 responsive to at least signal CKPBI.

In operation 912 of method 900, the first latch (201A) causes the first latch output signal (CLK_EN) to transition from the second voltage level (VDD) to the first voltage level (VSS) in response to the transition of the inverted first latch output signal (CLK_ENB) from the first voltage level to the second voltage level. In some embodiments, operation 912 is performed by NOR gate 208 at time t7 (FIG. 3).

In operation 914 of method 900, an inverter (e.g., inverter 228) causes a second control signal (CKPI) to transition from the first voltage level to the second voltage level in response to the transition of the output clock signal (CKPB) from the second voltage level to the first voltage level. In some embodiments, operation 914 is performed at time t5 (FIG. 3).

In operation 916 of method 900, the enable signal (CEB) transitions from the first voltage level to the second voltage level. In some embodiments, operation 916 is performed at time t9 (FIG. 3).

In operation 918 of method 900, the clock trigger circuit (210/212) pulls the first node (N1) from the first voltage level to the second voltage level in response to a transition of the first clock signal (CLK) from the second voltage level to the first voltage level. In some embodiments, the pulling of the first node of operation 918 thereby causes the first control signal (CLKB) of the clock trigger circuit 201B to transition from the first voltage level to the second voltage level.

In operation 920 of method 900, a reset signal (e.g., signal RSTCKB) transitions from the second voltage level to the first voltage level in response to the transition of the output clock signal (e.g., signal CKPB) from the second voltage level to the first voltage level. In some embodiments, operation 920 occurs at least in response to the transition of the second control signal (CKPI) from the first voltage level to the second voltage level.

In operation 922 of method 900, the first trigger circuit (201C) causes the output clock signal (CKPB) to transition from the first voltage level to the second voltage level in response to the transition of the reset signal (RSTCKB) from the second voltage level to the first voltage level.

In some embodiments, operation 922 includes causing a second N-type transistor (e.g., NMOS transistor 222) to turn off, in response to the transition of the reset signal (e.g., signal RSTCKB) from the second voltage level to the first voltage level, thereby disconnecting the second node (e.g., node N3) from a third N-type transistor (e.g., NMOS transistor 226).

In some embodiments, operation 922 further includes causing a first P-type transistor (e.g., PMOS transistor 220) to turn on, in response to the transition of the reset signal (e.g., signal RSTCKB) from the second voltage level to the first voltage level VSS, thereby pulling the second node (e.g., node N3) towards the second voltage level of supply voltage VDD.

In operation 924 of method 900, the reset signal (e.g., signal RSTCKB) transitions from the first voltage level VSS to the second voltage level VDD in response to the transition of the output clock signal (e.g., signal CKPB) from the first voltage level to the second voltage level. In some embodiments, operation 924 occurs at least in response to the transition of the second control signal (CKPI) from the second voltage level to the first voltage level. For example, in some embodiments, operation 924 occurs after time t16 of FIG. 3 which corresponds to the second control signal CKPI transitioning to the first voltage level which turns off NMOS transistor 226 and prevents NMOS transistor 226 from pulling the second node (N3) towards the first voltage level.

In some embodiments, operation 924 includes causing the second N-type transistor (e.g., NMOS transistor 222) to turn on, in response to the transition of the reset signal (e.g., signal RSTCKB) from the first voltage level to the second voltage level, thereby connecting the second node (e.g., node N3) to the third N-type transistor (226).

In some embodiments, operation 924 further includes causing the first P-type transistor (e.g., PMOS transistor 220) to turn off, in response to the transition of the reset signal (e.g., signal RSTCKB) from the first voltage level to the second voltage level, thereby disconnecting the second node (e.g., node N3) from the third N-type transistor (226) or the supply voltage VDD.

While method 900 was described above with reference to FIGS. 2-3, it is understood that method 900 utilizes the features of one or more of FIGS. 4-5, FIG. 6 or FIG. 7. For example, in some embodiments, method 900 is utilized with the clock circuit 500 of FIG. 5 and the level shifter 600 of FIG. 6. In these embodiments, operation 902 of method 900 further comprises receiving, by the clock trigger circuit, a second clock signal (CLK_LS) having a second voltage swing (VDDM) different from a first voltage swing (VDD) of the first clock signal. Furthermore, in these embodiments, the other operations of method 900 would be performed with at least the first clock signal (CLK) or the second clock signal (CLK_LS), and the second voltage level VDD is substituted with the supply voltage VDDM. For example, in some embodiments, causing the clock trigger circuit to pull the first node comprises causing the clock trigger circuit to pull the first node from the first voltage level to a third voltage level in response to a transition of the second clock signal from the third voltage level to the first voltage level, the third voltage level being different from the first voltage level and the second voltage level.

One aspect of this description relates to a clock circuit. The clock circuit includes a latch circuit configured to latch an enable signal, and to generate a latch output signal based on at least a first clock signal and a first output clock signal. The clock circuit further includes a memory state latch circuit configured to latch a second output clock signal responsive to a third output clock signal. The clock circuit further includes a first inverter coupled between the latch circuit and the memory state latch circuit, and configured to generate the first output clock signal responsive to the third output clock signal, the third output clock signal being inverted from the first output clock signal. The clock circuit further includes a memory state trigger circuit coupled to at least the memory state latch circuit, and configured to generate the second output clock signal responsive to the latch output signal. The clock circuit further includes a second inverter coupled to at least the latch circuit or the memory state trigger circuit by a first node, configured to generate the first clock signal responsive to a second clock signal, and configured to control the latch circuit and the memory state trigger circuit based on at least the first clock signal, the second clock signal being inverted from the first clock signal.

Another aspect of this description relates to a clock circuit. The clock circuit includes a latch circuit configured to latch an enable signal, and to generate a latch output signal based on at least a first clock signal and a first output clock signal. The clock circuit further includes a memory state latch circuit configured to latch a second output clock signal responsive to a third output clock signal. The clock circuit further includes a first inverter coupled between the latch circuit and the memory state latch circuit, and configured to generate the first output clock signal responsive to the third output clock signal, the third output clock signal being inverted from the first output clock signal. The clock circuit further includes a memory state trigger circuit coupled to at least the memory state latch circuit, and configured to generate the second output clock signal responsive to at least the latch output signal or a reset signal. The clock circuit further includes a clock trigger circuit coupled to at least the latch circuit or the memory state trigger circuit by a first node, configured to generate the first clock signal responsive to a second clock signal and a third clock signal, and configured to control the latch circuit and the memory state trigger circuit based on at least the first clock signal, the second clock signal being inverted from the first clock signal. The clock circuit further includes a level shifter circuit coupled to at least the memory state trigger circuit or the clock trigger circuit, and configured to generate the third clock signal from the second clock signal.

Yet another aspect of this description relates to a method of operating a clock circuit. The method includes receiving, by a clock trigger circuit, a first clock signal and a second clock signal; causing, by a latch circuit, a latch output signal to transition from a first voltage level to a second voltage level different from the first voltage level; causing a clock trigger circuit to pull a first node from the second voltage level to the first voltage level in response to a transition of the first clock signal from the first voltage level to the second voltage level and a transition of the second clock signal from the first voltage level to a third voltage level different from the second voltage level, the first clock signal having a first voltage swing, the second clock signal having a second voltage swing different from the first voltage swing, the causing the clock trigger circuit to pull the first node includes thereby causing a first control signal of the clock trigger circuit to transition from the second voltage level to the first voltage level, the clock trigger circuit being coupled to at least an input of the latch circuit or an input of a memory state trigger circuit by the first node, and the first control signal being fed back from the clock trigger circuit to the input of the latch circuit from the first node; causing, by the memory state trigger circuit, an output clock signal to transition from the second voltage level to the first voltage level in response to at least the transition of the first clock signal to the second voltage level; and causing, by the latch circuit, an inverted latch output signal to transition from the first voltage level to the second voltage level.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, etc.) can be used in place of the discrete capacitor. The above illustrations include exemplary steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A clock circuit, comprising:
   a latch circuit configured to latch an enable signal, and to generate a latch output signal based on at least a first clock signal and a first output clock signal;
   a memory state latch circuit configured to latch a second output clock signal responsive to a third output clock signal;
   a first inverter coupled between the latch circuit and the memory state latch circuit, and configured to generate the first output clock signal responsive to the third output clock signal, the third output clock signal being inverted from the first output clock signal;
   a memory state trigger circuit coupled to at least the memory state latch circuit, and configured to generate the second output clock signal responsive to the latch output signal; and
   a second inverter coupled to at least the latch circuit or the memory state trigger circuit by a first node, configured to generate the first clock signal responsive to a second clock signal, and configured to control the latch circuit and the memory state trigger circuit based on at least the first clock signal, the second clock signal being inverted from the first clock signal.

2. The clock circuit of claim 1, wherein the second inverter comprises:
   a first P-type transistor having a gate terminal configured to receive the second clock signal, a source terminal of the first P-type transistor is coupled with a first voltage supply, and a drain terminal of the first P-type transistor is coupled with at least the latch circuit and the memory state trigger circuit by the first node; and
   a first N-type transistor having a gate terminal coupled to the gate terminal of the first P-type transistor and configured to receive the second clock signal, a source terminal of the first N-type transistor is coupled with a second voltage supply different from the first voltage supply, and a drain terminal of the first N-type transistor is coupled with the memory state trigger circuit, the latch circuit, and the drain terminal of the first P-type transistor by the first node.

3. The clock circuit of claim 1, wherein the memory state latch circuit comprises:
a third inverter comprising:
an input terminal configured to receive the second output clock signal, and being coupled to the memory state trigger circuit by a second node; and
an output terminal coupled with an input terminal of the first inverter, and being configured to output the third output clock signal responsive to the second output clock signal, the third output clock signal being inverted from the second output clock signal.

4. The clock circuit of claim 3, wherein the memory state latch circuit further comprises:
a first P-type transistor having a gate terminal configured to receive the third output clock signal, a source terminal of the first P-type transistor being coupled with a first voltage supply, and a drain terminal of the first P-type transistor being coupled with the memory state trigger circuit by a third node; and
a first N-type transistor having a gate terminal configured to receive the third output clock signal, a source terminal of the first N-type transistor being coupled with a second voltage supply different from the first voltage supply, and a drain terminal of the first N-type transistor being coupled with the memory state trigger circuit by a fourth node,
wherein the gate terminal of the first N-type transistor, the gate terminal of the first P-type transistor and the output terminal of the third inverter are coupled together.

5. The clock circuit of claim 1, wherein the memory state trigger circuit comprises:
a first N-type transistor having a gate terminal configured to receive the latch output signal and being coupled to the latch circuit by a second node, a source terminal of the first N-type transistor being coupled with at least the first node, and a drain terminal of the first N-type transistor being coupled with at least a third node of the memory state trigger circuit; and
a first P-type transistor having a gate terminal configured to receive the second clock signal, a source terminal of the first P-type transistor being coupled with at least a fourth node of the memory state trigger circuit, and a drain terminal of the first P-type transistor being coupled with at least the drain terminal of the first N-type transistor by the third node of the memory state trigger circuit.

6. The clock circuit of claim 5, wherein the memory state trigger circuit further comprises:
a second P-type transistor having a gate terminal configured to receive the latch output signal, and being coupled to the gate terminal of the first N-type transistor and the latch circuit by the second node, a source terminal of the second P-type transistor being coupled with at least the source terminal of the first P-type transistor by the fourth node of the memory state trigger circuit, and a drain terminal of the second P-type transistor being coupled with at least the drain terminal of the first P-type transistor and the drain terminal of the first N-type transistor by the third node of the memory state trigger circuit.

7. The clock circuit of claim 6, wherein the memory state trigger circuit further comprises:
a second N-type transistor having a gate terminal configured to receive a reset signal, a source terminal of the second N-type transistor being coupled with the memory state latch circuit, and a drain terminal of the second N-type transistor being coupled with at least the drain terminal of the second P-type transistor, the drain terminal of the first P-type transistor, and the drain terminal of the first N-type transistor by the third node of the memory state trigger circuit; and a third P-type transistor having a gate terminal configured to receive the reset signal and being coupled to the gate terminal of the second N-type transistor, a source terminal of the third P-type transistor being coupled with a first voltage supply, and a drain terminal of the third P-type transistor being coupled with the drain terminal of the first N-type transistor, the drain terminal of the second N-type transistor, the drain terminal of the second P-type transistor and the drain terminal of the first P-type transistor by the third node of the memory state trigger circuit.

8. The clock circuit of claim 6, wherein the memory state trigger circuit further comprises:
a second N-type transistor having a gate terminal configured to receive a reset signal, a source terminal of the second N-type transistor being coupled with the memory state latch circuit, and a drain terminal of the second N-type transistor being coupled with at least the drain terminal of the second P-type transistor, the drain terminal of the first P-type transistor, and the drain terminal of the first N-type transistor by the third node of the memory state trigger circuit; and a third P-type transistor having a gate terminal configured to receive the reset signal and being coupled to the gate terminal of the second N-type transistor, a source terminal of the third P-type transistor being coupled with a first voltage supply, and a drain terminal of the third P-type transistor being coupled with the source terminal of the second P-type transistor and the source terminal of the first P-type transistor by the fourth node of the memory state trigger circuit.

9. A clock circuit, comprising:
a latch circuit configured to latch an enable signal, and to generate a latch output signal based on at least a first clock signal and a first output clock signal;
a memory state latch circuit configured to latch a second output clock signal responsive to a third output clock signal;
a first inverter coupled between the latch circuit and the memory state latch circuit, and configured to generate the first output clock signal responsive to the third output clock signal, the third output clock signal being inverted from the first output clock signal;
a memory state trigger circuit coupled to at least the memory state latch circuit, and configured to generate the second output clock signal responsive to at least the latch output signal or a reset signal;
a clock trigger circuit coupled to at least the latch circuit or the memory state trigger circuit by a first node, configured to generate the first clock signal responsive to a second clock signal and a third clock signal, and configured to control the latch circuit and the memory state trigger circuit based on at least the first clock signal, the second clock signal being inverted from the first clock signal; and
a level shifter circuit coupled to at least the memory state trigger circuit or the clock trigger circuit, and configured to generate the third clock signal from the second clock signal.

10. The clock circuit of claim 9, wherein the latch circuit comprises:
an OR logic gate comprising:
a first input terminal of the OR logic gate being coupled to the clock trigger circuit and the memory state trigger circuit by the first node, and being configured to receive the first clock signal;
a second input terminal of the OR logic gate being coupled to the memory state trigger circuit by a second node, and being configured to receive the latch output signal; and
an output terminal of the OR logic gate being configured to output an OR output signal based on the first clock signal and the latch output signal.

11. The clock circuit of claim 10, wherein the latch circuit further comprises:
a NAND logic gate comprising:
a first input terminal of the NAND logic gate being coupled to the output terminal of the OR logic gate, the first input terminal of the NAND logic gate being configured to receive the OR output signal;
a second input terminal of the NAND logic gate being configured to receive the first output clock signal, and being coupled to an output terminal of the first inverter; and
an output terminal of the NAND logic gate being configured to output a NAND output signal based on the OR output signal and the first output clock signal.

12. The clock circuit of claim 11, wherein the latch circuit further comprises:
a NOR logic gate comprising:
a first input terminal of the NOR logic gate being configured to receive the enable signal;
a second input terminal of the NOR logic gate being coupled to the output terminal of the NAND logic gate, and being configured to receive the NAND output signal; and
an output terminal of the NOR logic gate being coupled to the second input terminal of the OR logic gate and the memory state trigger circuit by the second node, and being configured to output the latch output signal based on the enable signal and the NAND output signal, the NOR logic gate being configured to set the latch output signal.

13. The clock circuit of claim 9, wherein the clock trigger circuit comprises:
a first N-type transistor having a drain terminal, a gate terminal of the first N-type transistor being configured to receive the second clock signal, and a source terminal of the first N-type transistor being coupled with a first voltage supply;
a second N-type transistor having a drain terminal, a gate terminal of the second N-type transistor being configured to receive the third clock signal, and a source terminal of the second N-type transistor being coupled with the first voltage supply and the source terminal of the first N-type transistor;
a first P-type transistor having a drain terminal, a gate terminal of the first P-type transistor configured to receive the second clock signal, and a source terminal of the first P-type transistor coupled with a second voltage supply different from the first voltage supply; and
a second P-type transistor having a drain terminal, a gate terminal of the second P-type transistor being configured to receive the third clock signal, and a source terminal of the second P-type transistor being coupled with the drain terminal of the first P-type transistor;
wherein each of the gate terminal of the second N-type transistor and the gate terminal of the second P-type transistor are coupled together;
wherein each of the gate terminal of the first N-type transistor and the gate terminal of the first P-type transistor are coupled together; and
wherein each of the drain terminal of the first N-type transistor, the drain terminal of the second N-type transistor, the drain terminal of the second P-type transistor, the latch circuit, the memory state trigger circuit, and the first node are coupled together.

14. The clock circuit of claim 9, wherein the memory state trigger circuit comprises:
a first N-type transistor having a gate terminal configured to receive the latch output signal, and being coupled to the latch circuit by a second node, a source terminal of the first N-type transistor being coupled with the first node, and a drain terminal of the first N-type transistor being coupled with at least a third node of the memory state trigger circuit; and
a first P-type transistor having a gate terminal configured to receive the second clock signal, a source terminal of the first P-type transistor being coupled to a fourth node of the memory state trigger circuit, and a drain terminal of the first P-type transistor being coupled with at least the drain terminal of the first N-type transistor by the third node of the memory state trigger circuit.

15. The clock circuit of claim 14, wherein the memory state trigger circuit further comprises:
a second P-type transistor having a gate terminal configured to receive the third clock signal, and being coupled to an output terminal of the level shifter circuit, a source terminal of the second P-type transistor being coupled with at least a fifth node of the memory state trigger circuit, and a drain terminal of the second P-type transistor being coupled with the source terminal of the first P-type transistor by the fourth node of the memory state trigger circuit; and
a third P-type transistor having a gate terminal configured to receive the latch output signal, a source terminal of the third P-type transistor being coupled with at least the source terminal of the second P-type transistor by the fifth node of the memory state trigger circuit, and a drain terminal of the third P-type transistor being coupled with at least the drain terminal of the first N-type transistor and the drain terminal of the first P-type transistor by the third node of the memory state trigger circuit.

16. The clock circuit of claim 15, wherein the memory state trigger circuit further comprises:
a second N-type transistor having a gate terminal configured to receive the reset signal, a source terminal of the second N-type transistor being coupled with the memory state latch circuit, and a drain terminal of the second N-type transistor being coupled with at least the drain terminal of the first N-type transistor, the drain terminal of the first P-type transistor and the drain terminal of the second P-type transistor by the third node of the memory state trigger circuit; and
a fourth P-type transistor having a gate terminal configured to receive the reset signal, a source terminal of the fourth P-type transistor being coupled with a first voltage supply, and one of:
a drain terminal of the fourth P-type transistor being coupled with the drain terminal of the second N-type transistor, the drain terminal of the first N-type transistor, the drain terminal of the first P-type transistor and the drain terminal of the second P-type transistor by the third node of the memory state trigger circuit; or the drain terminal of the fourth P-type transistor being coupled with the source terminal of the second P-type transistor and the source terminal of the third P-type transistor by the fifth node of the memory state trigger circuit.

17. A method of operating a clock circuit, the method comprising:

receiving, by a clock trigger circuit, a first clock signal and a second clock signal;

causing, by a latch circuit, a latch output signal to transition from a first voltage level to a second voltage level different from the first voltage level;

causing the clock trigger circuit to pull a first node from the second voltage level to the first voltage level in response to a transition of the first clock signal from the first voltage level to the second voltage level and a transition of the second clock signal from the first voltage level to a third voltage level different from the second voltage level, the first clock signal having a first voltage swing, the second clock signal having a second voltage swing different from the first voltage swing, the causing the clock trigger circuit to pull the first node includes thereby causing a first control signal of the clock trigger circuit to transition from the second voltage level to the first voltage level, the clock trigger circuit being coupled to at least an input of the latch circuit or an input of a memory state trigger circuit by the first node, and the first control signal being fed back from the clock trigger circuit to the input of the latch circuit from the first node;

causing, by the memory state trigger circuit, an output clock signal to transition from the second voltage level to the first voltage level in response to at least the transition of the first clock signal to the second voltage level; and causing, by the latch circuit, an inverted latch output signal to transition from the first voltage level to the second voltage level.

18. The method of claim 17, further comprising:

causing, by the latch circuit, the latch output signal to transition from the second voltage level to the first voltage level; and causing, by an inverter, a second control signal to transition from the first voltage level to the second voltage level.

19. The method of claim 18, further comprising:

causing an enable signal to transition from the first voltage level to the second voltage level; and causing the clock trigger circuit to pull the first node from the first voltage level to the second voltage level in response to a transition of the first clock signal from the second voltage level to the first voltage level.

20. The method of claim 19, further comprising:

generating, by a level shifter circuit, the first clock signal in response to the second clock signal, the level shifter circuit being coupled to the clock trigger circuit;

causing a reset signal to transition from the second voltage level to the first voltage level in response to the transition of the output clock signal from the second voltage level to the first voltage level;

causing the output clock signal to transition from the first voltage level to the second voltage level in response to the transition of the reset signal from the second voltage level to the first voltage level; and causing the reset signal to transition from the first voltage level to the second voltage level in response to the transition of the output clock signal from the first voltage level to the second voltage level.

* * * * *